(12) United States Patent
Aggarwal

(10) Patent No.: US 12,191,257 B2
(45) Date of Patent: Jan. 7, 2025

(54) ELECTRICAL BRIDGE PACKAGE WITH INTEGRATED OFF-BRIDGE PHOTONIC CHANNEL INTERFACE

(71) Applicant: Celestial AI Inc., Santa Clara, CA (US)

(72) Inventor: Ankur Aggarwal, Pleasanton, CA (US)

(73) Assignee: CELESTIAL AI INC., Santa Clara, CA (US)

( * ) Notice: Subject to any disclaimer, the term of this patent is extended or adjusted under 35 U.S.C. 154(b) by 0 days.

(21) Appl. No.: 18/407,410

(22) Filed: Jan. 8, 2024

(65) Prior Publication Data

US 2024/0145393 A1 May 2, 2024

Related U.S. Application Data

(63) Continuation-in-part of application No. 18/217,898, filed on Jul. 3, 2023, which is a continuation-in-part of application No. 18/076,196, filed on Dec. 6, 2022, and a continuation-in-part of application No. 18/076,210, filed on Dec. 6, 2022.

(Continued)

(51) Int. Cl.
| | |
|---|---|
| *H01L 23/538* | (2006.01) |
| *G02B 6/122* | (2006.01) |
| *G02B 6/136* | (2006.01) |
| *G02B 6/43* | (2006.01) |
| *H01L 23/00* | (2006.01) |
| *H01L 23/498* | (2006.01) |
| *H01L 25/065* | (2023.01) |

(52) U.S. Cl.
CPC ........ *H01L 23/5381* (2013.01); *G02B 6/1225* (2013.01); *G02B 6/136* (2013.01); *G02B 6/43* (2013.01); *H01L 23/49822* (2013.01); *H01L 24/08* (2013.01); *H01L 24/16* (2013.01); *H01L 25/0652* (2013.01); *H01L 2224/08146* (2013.01); *H01L 2224/08153* (2013.01); *H01L 2224/16146* (2013.01); *H01L 2224/16155* (2013.01); *H01L 2924/12043* (2013.01); *H01L 2924/141* (2013.01); *H01L 2924/1434* (2013.01); *H01L 2924/182* (2013.01)

(58) Field of Classification Search
None
See application file for complete search history.

(56) References Cited

U.S. PATENT DOCUMENTS

| | | | |
|---|---|---|---|
| 4,912,706 | A | 3/1990 | Eisenberg et al. |
| 4,934,775 | A | 6/1990 | Koai |

(Continued)

FOREIGN PATENT DOCUMENTS

| | | |
|---|---|---|
| AU | 2019100030 A | 2/2019 |
| AU | 2019100679 A | 8/2019 |

(Continued)

OTHER PUBLICATIONS

U.S. Appl. No. 63/049,928, filed Jul. 9, 2020, Pleros et al.

(Continued)

*Primary Examiner* — Long Pham
(74) *Attorney, Agent, or Firm* — Ray Quinney & Nebeker; James Bullough

(57) ABSTRACT

A circuit package is described that includes a photonic interposer, a second interposer, and a die partially overlapping and connected to both the photonic interposer and the second interposer.

25 Claims, 13 Drawing Sheets

Related U.S. Application Data

(60) Provisional application No. 63/437,639, filed on Jan. 6, 2023, provisional application No. 63/437,641, filed on Jan. 6, 2023, provisional application No. 63/392,475, filed on Jul. 26, 2022.

(56) References Cited

U.S. PATENT DOCUMENTS

| | | | |
|---|---|---|---|
| 5,457,563 A | 10/1995 | Van Deventer | |
| 6,249,621 B1 | 6/2001 | Sargent et al. | |
| 6,714,552 B1 | 3/2004 | Cotter | |
| 7,034,641 B1 | 4/2006 | Clarke et al. | |
| 7,778,501 B2 | 8/2010 | Beausoleil et al. | |
| 7,889,996 B2 | 2/2011 | Zheng et al. | |
| 7,894,699 B2 | 2/2011 | Beausoleil | |
| 7,961,990 B2 | 6/2011 | Krishnamoorthy et al. | |
| 8,064,739 B2 | 11/2011 | Binkert et al. | |
| 8,213,751 B1 | 7/2012 | Ho et al. | |
| 8,260,147 B2 | 9/2012 | Scandurra et al. | |
| 8,285,140 B2 | 10/2012 | Mccracken et al. | |
| 8,326,148 B2 | 12/2012 | Bergman et al. | |
| 8,340,517 B2 | 12/2012 | Shacham et al. | |
| 8,447,146 B2 | 5/2013 | Beausoleil et al. | |
| 8,611,747 B1 | 12/2013 | Wach | |
| 9,036,482 B2 | 5/2015 | Lea | |
| 9,369,784 B2 | 6/2016 | Zid et al. | |
| 9,495,295 B1 | 11/2016 | Dutt et al. | |
| 9,791,761 B1 | 9/2017 | Li et al. | |
| 9,831,360 B2 | 11/2017 | Knights et al. | |
| 9,882,655 B2 | 1/2018 | Li et al. | |
| 10,031,287 B1 | 7/2018 | Heroux et al. | |
| 10,054,737 B2 * | 8/2018 | Kobrinsky | H01L 23/49827 |
| 10,107,959 B2 | 10/2018 | Heroux et al. | |
| 10,117,007 B2 | 10/2018 | Song et al. | |
| 10,185,085 B2 | 1/2019 | Huangfu et al. | |
| 10,225,632 B1 | 3/2019 | Dupuis et al. | |
| 10,250,958 B2 | 4/2019 | Chen et al. | |
| 10,281,747 B2 | 5/2019 | Padmaraju et al. | |
| 10,365,445 B2 | 7/2019 | Badihi et al. | |
| 10,365,447 B2 * | 7/2019 | Mekis | G02B 6/4208 |
| 10,564,512 B2 | 2/2020 | Sun et al. | |
| 10,598,852 B1 | 3/2020 | Zhao et al. | |
| 10,651,933 B1 | 5/2020 | Chiang et al. | |
| 10,837,827 B2 | 11/2020 | Nahmias et al. | |
| 10,908,369 B1 | 2/2021 | Mahdi et al. | |
| 10,915,297 B1 | 2/2021 | Halutz et al. | |
| 10,935,722 B1 | 3/2021 | Li et al. | |
| 10,951,325 B1 | 3/2021 | Rathinasamy et al. | |
| 10,962,728 B2 | 3/2021 | Nelson et al. | |
| 10,976,491 B2 | 4/2021 | Coolbaugh et al. | |
| 11,107,770 B1 | 8/2021 | Ramalingam et al. | |
| 11,165,509 B1 | 11/2021 | Nagarajan et al. | |
| 11,165,711 B2 | 11/2021 | Mehrvar et al. | |
| 11,233,580 B2 | 1/2022 | Meade et al. | |
| 11,321,092 B1 | 5/2022 | Raikin et al. | |
| 11,336,376 B1 | 5/2022 | Xie | |
| 11,493,714 B1 | 11/2022 | Mendoza et al. | |
| 11,500,153 B2 | 11/2022 | Meade et al. | |
| 11,509,397 B2 | 11/2022 | Ma et al. | |
| 11,769,710 B2 | 9/2023 | Refai-Ahmed et al. | |
| 11,817,903 B2 | 11/2023 | Pleros et al. | |
| 2004/0213229 A1 | 10/2004 | Chang et al. | |
| 2006/0159387 A1 | 7/2006 | Handelman | |
| 2006/0204247 A1 | 9/2006 | Murphy | |
| 2011/0206379 A1 | 8/2011 | Budd | |
| 2012/0020663 A1 | 1/2012 | McLaren | |
| 2012/0251116 A1 | 10/2012 | Li et al. | |
| 2013/0275703 A1 | 10/2013 | Schenfeld | |
| 2013/0308942 A1 | 11/2013 | Ji et al. | |
| 2015/0109024 A1 | 4/2015 | Abdelfattah et al. | |
| 2015/0354938 A1 | 12/2015 | Mower et al. | |
| 2016/0116688 A1 | 4/2016 | Hochberg et al. | |
| 2016/0131862 A1 | 5/2016 | Rickman et al. | |
| 2016/0344507 A1 | 11/2016 | Marquardt et al. | |
| 2017/0045697 A1 | 2/2017 | Hochberg et al. | |
| 2017/0194309 A1 | 7/2017 | Evans et al. | |
| 2017/0194310 A1 | 7/2017 | Evans et al. | |
| 2017/0207600 A1 | 7/2017 | Klamkin et al. | |
| 2017/0220352 A1 | 8/2017 | Woo et al. | |
| 2017/0261708 A1 | 9/2017 | Ding et al. | |
| 2017/0285372 A1 | 10/2017 | Baba et al. | |
| 2018/0107030 A1 | 4/2018 | Morton et al. | |
| 2018/0260703 A1 | 9/2018 | Soljacic et al. | |
| 2019/0026225 A1 | 1/2019 | Gu et al. | |
| 2019/0049665 A1 | 2/2019 | Ma et al. | |
| 2019/0205737 A1 | 7/2019 | Bleiweiss et al. | |
| 2019/0265408 A1 | 8/2019 | Ji et al. | |
| 2019/0266088 A1 | 8/2019 | Kumar | |
| 2019/0266089 A1 | 8/2019 | Kumar | |
| 2019/0294199 A1 | 9/2019 | Carolan et al. | |
| 2019/0317285 A1 | 10/2019 | Liff | |
| 2019/0317287 A1 | 10/2019 | Raghunathan et al. | |
| 2019/0356394 A1 | 11/2019 | Bunandar et al. | |
| 2019/0372589 A1 | 12/2019 | Gould | |
| 2019/0385997 A1 | 12/2019 | Choi et al. | |
| 2020/0006304 A1 | 1/2020 | Chang et al. | |
| 2020/0125716 A1 | 4/2020 | Chittamuru et al. | |
| 2020/0142441 A1 | 5/2020 | Bunandar et al. | |
| 2020/0158967 A1 | 5/2020 | Winzer et al. | |
| 2020/0174707 A1 | 6/2020 | Johnson et al. | |
| 2020/0200987 A1 | 6/2020 | Kim | |
| 2020/0213028 A1 | 7/2020 | Behringer et al. | |
| 2020/0250532 A1 | 8/2020 | Shen et al. | |
| 2020/0284981 A1 | 9/2020 | Harris et al. | |
| 2020/0310761 A1 | 10/2020 | Rossi et al. | |
| 2020/0409001 A1 | 12/2020 | Liang et al. | |
| 2020/0410330 A1 | 12/2020 | Liu et al. | |
| 2021/0036783 A1 | 2/2021 | Bunandar et al. | |
| 2021/0064958 A1 | 3/2021 | Lin et al. | |
| 2021/0072784 A1 | 3/2021 | Lin et al. | |
| 2021/0116637 A1 | 4/2021 | Li et al. | |
| 2021/0132309 A1 | 5/2021 | Zhang et al. | |
| 2021/0132650 A1 | 5/2021 | Wenhua et al. | |
| 2021/0133547 A1 | 5/2021 | Wenhua et al. | |
| 2021/0173238 A1 | 6/2021 | Hosseinzadeh | |
| 2021/0257396 A1 | 8/2021 | Piggott et al. | |
| 2021/0271020 A1 | 9/2021 | Islam et al. | |
| 2021/0286129 A1 | 9/2021 | Fini et al. | |
| 2021/0305127 A1 | 9/2021 | Refai-Ahmed et al. | |
| 2021/0406164 A1 | 12/2021 | Grymel et al. | |
| 2021/0409848 A1 | 12/2021 | Saunders et al. | |
| 2022/0003948 A1 | 1/2022 | Zhou et al. | |
| 2022/0004029 A1 | 1/2022 | Meng | |
| 2022/0012578 A1 | 1/2022 | Brady et al. | |
| 2022/0012582 A1 | 1/2022 | Pleros et al. | |
| 2022/0044092 A1 | 2/2022 | Pleros et al. | |
| 2022/0091332 A1 | 3/2022 | Yoo et al. | |
| 2022/0092016 A1 | 3/2022 | Kumashikar | |
| 2022/0159860 A1 | 5/2022 | Winzer et al. | |
| 2022/0171142 A1 | 6/2022 | Wright et al. | |
| 2022/0302033 A1 | 9/2022 | Cheah et al. | |
| 2022/0342164 A1 | 10/2022 | Chen et al. | |
| 2022/0374575 A1 | 11/2022 | Ramey et al. | |
| 2022/0382005 A1 * | 12/2022 | Rusu | G02B 6/13 |
| 2023/0089415 A1 | 3/2023 | Zilkie et al. | |
| 2023/0197699 A1 * | 6/2023 | Spreitzer | H01L 24/17 385/14 |
| 2023/0251423 A1 | 8/2023 | Lopez et al. | |
| 2023/0258886 A1 | 8/2023 | Liao | |
| 2023/0282547 A1 | 9/2023 | Refai-Ahmed et al. | |
| 2023/0308188 A1 | 9/2023 | Dorta-Quinones | |
| 2023/0314702 A1 | 10/2023 | Yu | |
| 2023/0344518 A1 * | 10/2023 | Kalman | H04B 10/801 |
| 2023/0376818 A1 | 11/2023 | Nowak | |
| 2023/0393357 A1 | 12/2023 | Ranno | |

FOREIGN PATENT DOCUMENTS

| | | | |
|---|---|---|---|
| AU | 2019100750 | A | 8/2019 |
| CN | 102281478 | A | 12/2011 |
| CN | 102333250 | A | 1/2012 |
| CN | 102413039 | A | 4/2012 |
| CN | 102638311 | A | 8/2012 |
| CN | 102645706 | A | 8/2012 |

(56) References Cited

FOREIGN PATENT DOCUMENTS

| | | |
|---|---|---|
| CN | 202522621 U | 11/2012 |
| CN | 103369415 A | 10/2013 |
| CN | 103442311 A | 12/2013 |
| CN | 103580890 A | 2/2014 |
| CN | 104539547 A | 4/2015 |
| CN | 105451103 A | 3/2016 |
| CN | 205354341 U | 6/2016 |
| CN | 105812063 A | 7/2016 |
| CN | 105847166 A | 8/2016 |
| CN | 106126471 A | 11/2016 |
| CN | 106331909 A | 1/2017 |
| CN | 106407154 A | 2/2017 |
| CN | 106533993 A | 3/2017 |
| CN | 106549874 A | 3/2017 |
| CN | 106796324 | 5/2017 |
| CN | 106888050 A | 6/2017 |
| CN | 106911521 A | 6/2017 |
| CN | 106936708 A | 7/2017 |
| CN | 106936736 A | 7/2017 |
| CN | 106980160 A | 7/2017 |
| CN | 107911761 A | 4/2018 |
| CN | 108599850 A | 9/2018 |
| CN | 207835452 U | 9/2018 |
| CN | 108737011 A | 11/2018 |
| CN | 110266585 A | 9/2019 |
| CN | 110505021 A | 11/2019 |
| CN | 111208690 A | 5/2020 |
| CN | 111752891 A | 10/2020 |
| CN | 111770019 A | 10/2020 |
| CN | 111786911 A | 10/2020 |
| FR | 3007537 A | 12/2014 |
| GB | 2223867 | 4/1990 |
| IN | 201621017235 A | 7/2016 |
| IN | 202121008267 A | 4/2021 |
| JP | 6747660 B | 8/2020 |
| JP | 2020155112 | 9/2020 |
| JP | 202280020819.7 | 9/2024 |
| KR | 101242172 B | 3/2013 |
| KR | 101382606 B | 4/2014 |
| KR | 101465420 B | 11/2014 |
| KR | 101465498 B | 11/2014 |
| KR | 101541534 B | 8/2015 |
| KR | 101548695 B | 9/2015 |
| KR | 101766786 B | 8/2017 |
| KR | 101766792 B | 8/2017 |
| WO | WO2015176289 | 11/2015 |
| WO | WO2020072925 | 4/2020 |
| WO | WO2020102204 | 5/2020 |
| WO | WO2020191217 | 9/2020 |
| WO | WO2021021787 | 2/2021 |
| WO | WO2022032105 | 2/2022 |
| WO | WO2022133490 | 6/2022 |
| WO | WO2023177417 | 9/2022 |
| WO | WO2022266676 | 12/2022 |
| WO | WO2023177922 | 9/2023 |

OTHER PUBLICATIONS

U.S. Appl. No. 63/062,163, filed Aug. 6, 2020, Pleros et al.
U.S. Appl. No. 63/199,286, filed Dec. 17, 2020, Ma et al..
U.S. Appl. No. 63/199,412, filed Dec. 23, 2022, Ma et al..
U.S. Appl. No. 63/201,155, filed Apr. 15, 2021, Ma et al..
U.S. Appl. No. 63/261,974, filed Oct. 1, 2021, Pleros et al.
U.S. Appl. No. 63/212,353, filed Jun. 18, 2021, Winterbottom et al.
U.S. Appl. No. 17/807,692, filed Jun. 17, 2022, Winterbottom et al.
U.S. Appl. No. 17/807,694, filed Jun. 17, 2022, Winterbottom et al.
U.S. Appl. No. 17/807,698, filed Jun. 17, 2022, Winterbottom et al.
U.S. Appl. No. 17/807,699, filed Jun. 17, 2022, Winterbottom et al.
U.S. Appl. No. 17/807,695, filed Jun. 17, 2022, Winterbottom et al.
U.S. Appl. No. 63/321,453, filed Mar. 18, 2022, Bos et al.
U.S. Appl. No. 17/903,455, filed Sep. 6, 2022, Lazovsky et al.
U.S. Appl. No. 18/123,161, filed Mar. 17, 2023, Bos et al.
U.S. Appl. No. 17/957,731, filed Sep. 30, 2022, Pleros et al.
U.S. Appl. No. 17/957,812, filed Sep. 30, 2022, Pleros et al.
U.S. Appl. No. 63/420,323, filed Oct. 28, 2022, Sahni.
U.S. Appl. No. 18/123,170, filed Mar. 17, 2023, Sahni.
U.S. Appl. No. 63/420,330, filed Oct. 28, 2022, Sahni et al.
U.S. Appl. No. 63/428,663, filed Nov. 29, 2022, Sahni et al.
U.S. Appl. No. 63/441,689, filed Jan. 27, 2023, Winterbottom.
U.S. Appl. No. 63/579,486, filed Aug. 29, 2023, Aggarwal et al.
U.S. Appl. No. 63/535,509, filed Aug. 30, 2023, Winterbottom et al.
U.S. Appl. No. 63/535,511, filed Aug. 30, 2023, Winterbottom et al.
U.S. Appl. No. 63/535,512, filed Aug. 30, 2023, José Maia da Silva et al.
U.S. Appl. No. 63/592,509, filed Oct. 23, 2023, Aggarwal et al.
U.S. Appl. No. 63/592,517, filed Oct. 23, 2023, Winterbottom et al.
U.S. Appl. No. 18/473,898, filed Sep. 25, 2023, Pleros et al.
U.S. Appl. No. 18/523,667, filed Nov. 29, 2023, Sahni et al.
U.S. Appl. No. 18/293,673, filed Jan. 30, 2024, Bos et al.
U.S. Appl. No. 18/407,408, filed Jan. 8, 2024, Aggarwal.
U.S. Appl. No. 18/423,210, filed Jan. 25, 2024, Winterbottom.
U.S. Appl. No. 18/540,579, filed Dec. 14, 2023, Winterbottom et al.
U.S. Appl. No. 18/590,689, filed Feb. 28, 2024, Winterbottom et al.
U.S. Appl. No. 18/590,703, filed Feb. 28, 2024, Winterbottom et al.
U.S. Appl. No. 18/590,708, filed Feb. 28, 2024, Winterbottom et al.
Ardestani, et al., "Supporting Massive DLRM Inference Through Software Defined Memory", Nov. 8, 2021; 14 pages.
Agrawal, Govind; "Chapter 4—Optical Receivers", Fiber-Optic Communications Systems, John Wiley & Sons, Inc., (2002), pp. 133-182.
Burgwal, Roel et al; "Using an imperfect photonic network to implement random unitaries," Opt. Express 25(23), (2017), 28236-28245.
Capmany, Francoy et al.; "Thepgrammable processor" Nature Photonics, 109/22/20226, (2016), 5 pgs.
Carolan, Jacques et al.; "Universal Linear Optics"; arXiv: 1505.01182v1; (2015); 13 pgs.
Clements, William et al; "Optimal design for universal multiport interferometers"; Optica; vol. 3, No. 12; (2016), pp. 1460-1465.
Eltes, Felix et al.; "A BaTiO3-Based Electro-Optic Pockets Modulator Monolithically Integrated on an Advanced Silicon Photonics Platform"; J. Lightwave Technol. vol. 37, No. 5; (2019), pp. 1456-1462.
Eltes, Felix et al.; Low-Loss BaTiO3-Si Waveguides for Nonlinear Integrated Photonics; ACS Photon., vol. 3, No. 9; (2016), pp. 1698-1703.
Harris, NC et al.; "Efficient, compact and low loss thermo-optic phase shifter in colicon"; Opt. Express, vol. 22, No. 9; (2014), pp. 10487-10493.
Jiang, W.; "Nonvolatile and ultra-low-loss reconfigurable mode (De) multiplexer/switch using triple-waveguide coupler with Ge2Sb2Se4T31 phase change material"; Sci. Rep. vol. 8, No. 1; (2018), 12 pages.
Lambrecht, Joris et al.; "90-GB/s NRZ Optical Receiveer in Silicon Using a Fully Differential Transimpedance Aplifier," Journal of Lightwave Technology, vol. 37, No. 9; (2019); pp. 1964-1973.
Manolis, A. et al; "Non-volatile integrated photonic memory using GST phase change material on a fully eched Si3N4/SiO2 waveguide"; Conference on Lasers and Electro-optics; OSA Technical Digest, paper STh3R.4; (2020); 2 pages.
Miller, David A. et al; "Perfect optics with imperfect components"; Optica, vol. 2, No. 8; (2015); pp. 747-750.
Miller, David A. et al; "Self-Configuring Universal Linear Optical Component"; Photon. Res. 1; [Online]; Retrieved from the interent: URL: https://arxiv.org/ftp/arxiv/papers/1303/1303.4602.pdf; (2013), pp. 1-15.
Miscuglio, Mario et al.; "Photonic Tensor cores for machine learning"; Applied Physics Reviews, vol. 7, Issue 3; (2020), 16 pages.
Mourgias-Alexandris, George et al; "An all-optical neuron with sigmoid activation function;" Optics Express, vol. 27, No. 7; (2019), pp. 9620-9630.
Mourgias-Alexandris, George et al; Neuromorphic Photonics with Coherent Linear Neurons Using Dual-IQ Modulation Cells, Journal of Lightwave Technology, vol. 38, No. 4; Feb. 15, 2020, pp. 811-819.

(56) References Cited

OTHER PUBLICATIONS

Pai, Sunil et al.; "Parallel Programming of an Arbitrary Feedforward Photonic Network"; IEEE Journal of Selected Topics in Quantum Electronics, vol. 26, No. 5; (2020), 13 pages.
Perez, Daniel et al. "Reconfigurable lattice mesh designs for prgrammable photonic processors"; Optics Express vol. 24, Issue 11; (2016); pp. 12093-12106.
Raj, Mayank et al.; "Design of a 50-GB/s Hybid Integrated Si-Photonic Optical Link in 16-nm FinFET"; IEEE Journal of Solid-State Circuits, vol. 55, No. 4, Apr. 2020, pp. 1086-1095.
Reck, M. et al; "Experimental Realization of any Discrete Unitary Operator"; Phys. Rev. Lett. 73; (1994); pp. 58-61.
Shen, Yichen et al; "Deep learning with coherent nanophotonic circuits"; https://arxiv.org/pdf/1610.02365.pdf; (2016); 8 pages.
Shi, Bin et al.; Numerical Simulation of an InP Photonic Integrated Cross-Connect for Deep Neural Networks on Chip; Applied Sciences, Jan. 9, 2020, pp. 1-15.
Shokraneh, Farhad et al; "The diamond mesh, a phase-error- and loss-tolerant fieldprogrammable MZI-based optical processor for optical neural networks" Opt. Express, vol. 28, No. 16; (2020); pp. 23495-23508.
Sun, Chen et al; "A 45 nm cmos-soi monolithic photonics platform with bit-statistics-based resonant microring thermal tuning"; IEEE Journal of Solid-State Circuits, vol. 51, No. 4; (2016); 20 pages.
Tait, Alexander et al; "Broadcast and Weight: An Intergated Network for Scalable Photonic Spike Processing"; Journal of Lightwave Technology, vol. 32, No. 21; (2014); pp. 4029-4041.
Yang, Lin et al; "On-chip CMOS-compatible optical signal processor"; Opt. Express, vol. 20, No. 12; (2012) pp. 13560-13565.
Zhuang, L. et al; Programmable photonic signal processor chip for radiofrequency applications; Optica 2; 854-859; (2015); 10 pages.
U.S. Appl. No. 17/395,849, Jan. 5, 2023, Office Action.
U.S. Appl. No. 17/395,849, Jul. 24, 2023, Notice of Allowance.
U.S. Appl. No. 17/645,001, Jul. 20, 2022, Notice of Allowance.
U.S. Appl. No. 18/540,579, Feb. 14, 2024, Office Action.
U.S. Appl. No. 17/807,692, Feb. 15, 2024, Restriction Requirement.
U.S. Appl. No. 18/407,408, Mar. 28, 2024, Office Action.
U.S. Appl. No. 18/407,410, Mar. 15, 2024, Restriction Requirement.
PCT/US2021/044956, Nov. 19, 2021, International Search Report and Written Opinion.
PCT/US2021/073003, Mar. 22, 2022, International Search Report and Written Opinion.
PCT/US2022/073039, Sep. 1, 2022, Invitation to Pay Additional Fees.
PCT/US2022/073039, Dec. 2, 2022, International Search Report and Written Opinion.
PCT/US2022/042621, Feb. 15, 2023, International Search Report and Written Opinion.
PCT/US2023/015680, May 23, 2023, Invitation to Pay Additional Fees.
PCT/US2023/015680, Aug. 23, 2023, International Search Report and Written Opinion.
20220404544, Jan. 19, 2024, Foreign Office Action.
202180068303.5, Jan. 20, 2024, Foreign Office Action.
PCT/US2022/042621, Feb. 26, 2024, International Preliminary Report on Patentability.
U.S. Appl. No. 63/392,475, Jul. 26, 2022, Aggarwal et al.
U.S. Appl. No. 18/076,196, Dec. 6, 2022, Aggarwal et al.
U.S. Appl. No. 18/076,210, Dec. 6, 2022, Aggarwal et al.
U.S. Appl. No. 18/217,898, Jul. 3, 2023, Aggarwal et al.
U.S. Appl. No. 63/437,639, Jan. 6, 2023, Plunkett et al.
U.S. Appl. No. 63/437,641, Jan. 6, 2023, Plunkett et al.
Hendry, G. et al.; "Circuit-Switched Memory Access in Photonic Interconnection Networks for High-Performance Embedded Computing," SC '10: Proceedings of the 2010 ACM/IEEE International Conference for High Performance Computing, Networking, Storage and Analysis, New Orleans, LA, USA, 2010, pp. 1-12.
Liu, Jifeng, et al; "Waveguide-integrated, ultralow-energy GeSi electro-absorption modulators", Nature Photonics, [Online] vol. 2, No. 7, May 30, 2008 (May 30, 2008), pp. 433-437.
Wu, Longsheng et al.; "Design of a broadband Ge 1-20 1-x Six electro-absorption modulator based on the Franz-Keldysh effect with thermal tuning", Optics Express, [Online] vol. 28, No. 5, Feb. 27, 2020 (Feb. 27, 2020), p. 7585.
Zhang, Yulong; "Building blocks of a silicon photonic integrated wavelength division multiplexing transmitter for detector instrumentation", Doktors Der Ingenieurwissenschaften (Dr.-Ing. ), Dec. 15, 2020 (Dec. 15, 2020), 128 pages.
U.S. Appl. No. 18/540,579, May 1, 2024, Office Action
U.S. Appl. No. 17/807,692, Jul. 12, 2024, Office Action
U.S. Appl. No. 17/903,455, Jun. 27, 2024, Office Action
2023-564535, Apr. 9, 2024, Foreign Office Action.
11202307570T, Apr. 10, 2024, Foreign Notice of Allowance.
202280020819.7, Apr. 4, 2024, Foreign Office Action.
202180093875.9, Apr. 12, 2024, Foreign Office Action.
PCT/US2024/010774, May 3, 2024, International Search Report and Written Opinion.
EP23220883, May 7, 2024, Extended European Search Report.
PCT/US2024/013168, May 8, 2024, International Search Report and Written Opinion.
22826043.6, Jun. 14, 2024, Extended European Search Report.
21853044.2, Jul. 23, 2024, Extended European Search Report.
U.S. Appl. No. 18/407,408, Jul. 30, 2024, Notice of Allowance.
U.S. Appl. No. 18/590,708, Aug. 7, 2024, Notice of Allowance.
PCT/US2023/015680, Aug. 8, 2024, International Preliminary Report on Patentability.
10-2023-7007856, Aug. 21, 2024, Foreign Notice of Allowance.
202180068303.5, Jul. 31, 2024, Foreign Notice of Allowance.
1020237024129, Aug. 2, 2024, Foreign Office Action.
1020237044346, Aug. 27, 2024, Foreign Office Action.
Dakkak, A.D. et al "Accelerating Reduction and Scan Using Tensor Core Units, 2019,ACM,pp. 46-57.".
U.S. Appl. No. 18/590,708, Oct. 1, 2024, Office Action.
U.S. Appl. No. 17/807,699, Oct. 1, 2024, Office Action.
U.S. Appl. No. 18/423,210, Sep. 30, 2024, Notice of Allowance.
U.S. Appl. No. 18/540,579, Oct. 8, 2024, Office Action.
U.S. Appl. No. 18/407,408, Oct. 2, 2024, Notice of Allowance.
2023-537068, Oct. 1, 2024, Foreign Office Action.
11202304676X, Oct. 4, 2024, Foreign Notice of Allowance.

\* cited by examiner

ELECTRICAL BRIDGE PACKAGE WITH INTEGRATED OFF-BRIDGE PHOTONIC CHANNEL INTERFACE

RELATED APPLICATIONS

This application claims priority to and the benefit of U.S. Provisional Patent Application Ser. No. 63/437,639, filed Jan. 6, 2023 and this application claims priority to and the benefit of U.S. Provisional Patent Application Ser. No. 63/437,641, filed Jan. 6, 2023. This application also claims priority to U.S. patent application Ser. No. 18/217,898, Filed Jul. 3, 2023, which is a continuation-in-part of U.S. patent application Ser. No. 18/076,196, filed Dec. 6, 2022, and is a continuation-in-part of U.S. patent application Ser. No. 18/076,210, filed Dec. 6, 2022, and this application claims the priority to and benefit of U.S. Provisional Patent Application No. 63/392,475, filed Jul. 26, 2022. All of these applications are incorporated by reference in their entireties.

BACKGROUND

Demands for artificial intelligence (AI) computing, such as machine learning (ML) and deep learning (DL), are increasing faster than they can be met by increases in available processing capacity. This rising demand and the growing complexity of AI models contribute to the need to connect many chips into a system where the chips can send data between each other with low latency and at high speed.

BRIEF SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

Additional features and advantages of embodiments of the disclosure will be set forth in the description which follows, and in part will be obvious from the description, or may be learned by the practice of such embodiments. The features and advantages of such embodiments may be realized and obtained by means of the instruments and combinations particularly pointed out in the appended claims. These and other features will become more fully apparent from the following description and appended claims, or may be learned by the practice of such embodiments as set forth hereinafter.

At least one implementation of the techniques described herein relates to a circuit package, including: a photonic interposer; a second interposer; a die partially overlapping and connected to both the photonic interposer and the second interposer.

In some implementations, the die is a first die. In some implementations, the die is in an electrical coupling with both the photonic interposer and the second interposer. In some implementations, the die includes an analog-mixed signal portion to enable a first processing element to transmit and/or receive data using the photonic interposer and an electronic portion to enable a second processing element to transmit and/or receive data using the second interposer.

In some implementations, the die partially vertically overlaps both the photonic interposer and the second interposer. In some implementations, the second interposer is a non-photonic interposer. In some implementations, the second interposer is an electrical interposer.

In some implementations, the second interposer is a second photonic interposer. In some implementations, one or more of the photonic interposer and the second interposer are photonic integrated circuits. In some implementations, one or more of the photonic interposer and the second interposer are photonic integrated circuits. In some implementations, the second interposer is an SI interposer. In some implementations, the second interposer is an SI bridge.

In some implementations, the photonic interposer and the second interposer are separated by a mold. In some implementations, the photonic interposer and the second interposer are adjacent. In some implementations, the photonic interposer and the second interposer are directly adjacent. In some implementations, the photonic interposer and the second interposer abut. In some implementations, the photonic interposer and the second interposer do not vertically overlap.

In some implementations, the die is an ASIC die. In some implementations, the die is a processor die. In some implementations, the die is an ARM processor die. In some implementations, the die is an image processor die.

In some implementations, one or more of the photonic interposer and the second interposer are formed of silicon or a silicon alloy. In some implementations, the photonic interposer and the second interposer are laterally surrounded by a mold. In some implementations, the mold formed of silicon or a silicon alloy. In some implementations, the mold includes a material that matches a thermal expansion of one or more of the photonic interposer and the second interposer.

In some implementations, the second interposer is a mold. In some implementations, the second interposer includes a through mold via. In some implementations, the second interposer includes a bond via array.

In some implementations, the circuit package further includes a second die. In some implementations, the second die does not vertically overlap the photonic interposer. In some implementations, the second die includes general purpose memory. In some implementations, the second die includes a processor. In some implementations, the processor is one or more of an image processor, a video processor, and a general purpose processor. In some implementations, the second die includes high bandwidth memory. In some implementations, the high bandwidth memory is HBM3.

In some implementations, the circuit package further includes a third die. In some implementations, the third die includes one or more of general purpose memory, high bandwidth memory, HBM3, a processor, an image processor, a video processor, and a general purpose processor. In some implementations, the third die does not vertically overlap the photonic interposer. In some implementations, the third die vertically overlaps the photonic interposer. In some implementations, the third die vertically overlaps the photonic interposer and the second interposer.

In some implementations, the circuit package further includes a fourth die. In some implementations, the circuit package further includes a second photonic interposer. In some implementations, the circuit package further includes a third photonic interposer. In some implementations, the circuit package further includes a third interposer. In some implementations, the circuit package further includes a substrate.

In some implementations, one or more dies (e.g., the die, the second die, the third die, the fourth die) include one or more processing elements. In some implementations, the one or more processing elements are one or more of a CPU, a GPU, a TPU, a tensor engine, a neural network, an AI accelerator, a router, a memory, a switch, a controller, an ASIC, an image processor, a video processor, and a bus.

In some implementations, one or more components of the circuit package described or claimed herein are connected to the substrate. In some implementations, the circuit package further includes a redistribution layer. In some implementations, the redistribution layer electrically connects the die to one or more of the second die, the third die, or the fourth die as described or claimed herein. In some implementations, the redistribution layer electrically connects to a top surface of the die to a top surface of the one or more of the second die, the third die, or the fourth die as described or claimed herein. In some implementations, the redistribution layer electrically connects to a bottom surface of the die to a top surface of the one or more of the second die, the third die, or the fourth die as described or claimed herein. In some implementations, the redistribution layer is about ten microns line per space. In some implementations, the redistribution layer is less than two microns thick in the vertical direction. In some implementations, the redistribution layer is less than two layers thick in the vertical direction.

In some implementations, the circuit package further includes one or more optical elements. In some implementations, the one or more optical elements include fiber array units. In some implementations, the optical elements are optically connected to one or more of the photonic interposer, the second interposer, the second photonic interposer, the third interposer, and the third photonic interposer as described or claimed herein. In some implementations, any redistribution layer material on the one or more of the photonic interposer, the second interposer, the second photonic interposer, the third interposer, and the third photonic interposer as described or claimed herein vertically below at least a portion of the one or more optical elements are omitted or removed.

At least one implementation of the techniques described herein relates to a circuit package, including: a photonic interposer, an electrical interposer, and a first die in an electrical coupling with both the photonic and electrical interposers. The first die includes an analog-mixed signal portion to enable a first processing element therein to transmit and/or receive data using the photonic interposer and an electronic portion to enable a second processing element therein to transmit and/or receive data using the electrical interposer. The circuit package includes a plurality of vias in the electrical interposer to enable the second processing element to transmit and receive data to one or more additional dies in electrical coupling with the electrical interposer.

BRIEF DESCRIPTION OF THE DRAWINGS

In order to describe the manner in which the above-recited and other features of the disclosure can be obtained, a more particular description will be rendered by reference to specific implementations thereof which are illustrated in the appended drawings. For better understanding, the like elements have been designated by like reference numbers throughout the various accompanying figures. While some of the drawings may be schematic or exaggerated representations of concepts, at least some of the drawings may be drawn to scale. Understanding that the drawings depict some example implementations, the implementations will be described and explained with additional specificity and detail through the use of the accompanying drawings in which:

FIG. 4-1 is a cutaway side view of an embodiment of a circuit package, according to at least one embodiment of the present disclosure.

FIG. 4-2 is a cutaway side view of an embodiment of a circuit package, according to at least one embodiment of the present disclosure.

FIG. 4-3 is a cutaway side view of an embodiment of a circuit package, according to at least one embodiment of the present disclosure.

DETAILED DESCRIPTION

The present disclosure is related to circuit packages and methods of manufacturing circuit packages. More specifically, the present disclosure is related to one or more circuit packages with a die that connects to a photonic interposer and a second interposer and methods of manufacturing the same.

Photonic interposers are very expensive to manufacture and/or purchase. At least one embodiment described and/or claimed herein reduces the overall cost of a circuit package by reducing the size of the photonic interposer. For example, dies that do not need to be connected to a photonic interposer may be connected to a non-photonic interposer (e.g., an electric interposer) while one or more dies that do need to be connected to the photonic interposer may be connected to both the photonic interposer and a second interposer (e.g., the non-photonic interposer or a second photonic interposer). Using a second interposer may reduce the overall cost of the circuit package as two smaller interposers may be less expensive to manufacture and/or purchase than a single large interposer. Using a non-photonic interposer with a photonic interposer may reduce the cost even more, as the costs of a non-photonic interposer is less expensive to manufacture and/or purchase than a photonic interposer of the same size.

Figure 1:
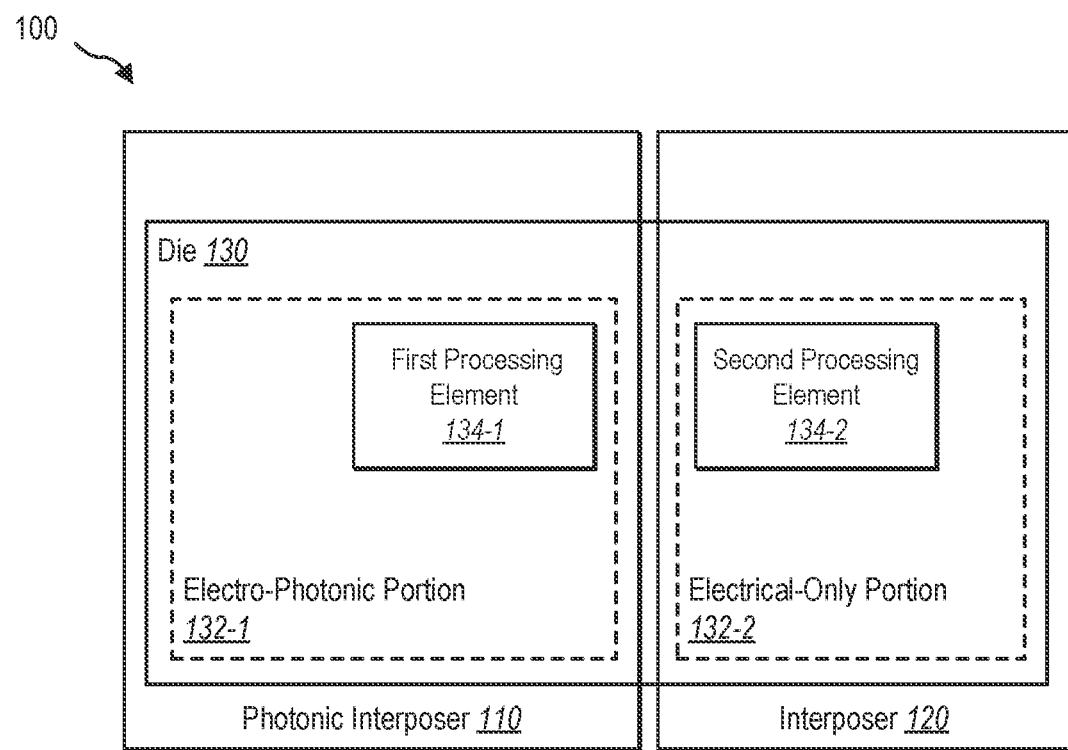
FIG. 1 is a top view of an embodiment of a circuit package, according to at least one embodiment of the present disclosure.
Figure 2:
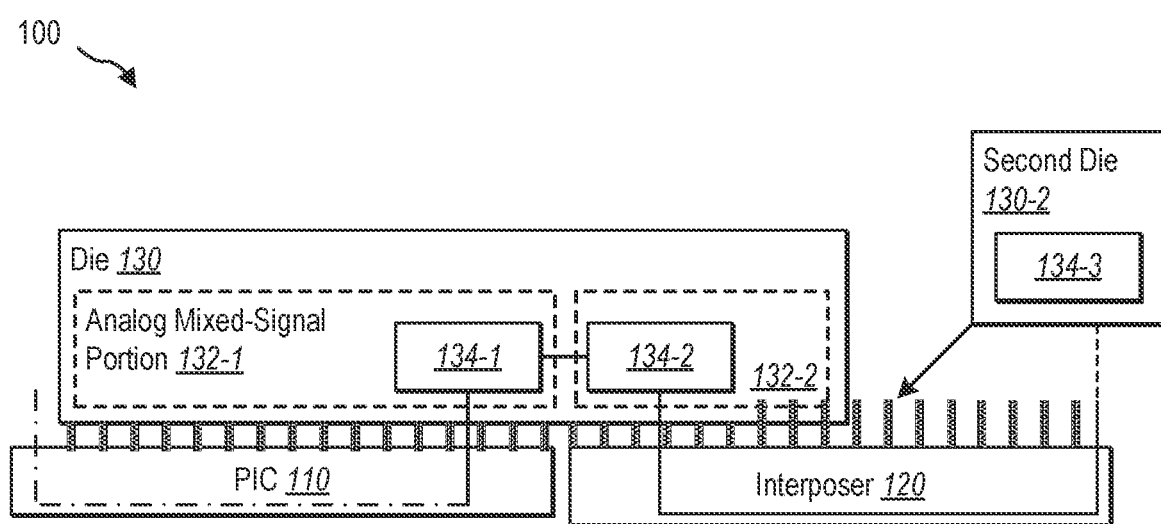
FIG. 2 is a cutaway side view of the embodiment of a circuit package shown in FIG. 1, according to at least one embodiment of the present disclosure.

FIG. 1 is a top view of an embodiment of an electrical bridge package with integrated off-bridge photonic channel interface (as used herein, circuit package 100). FIG. 2 is a cutaway side view of the embodiment of a circuit package shown in FIG. 1. The circuit package 100 may be manufactured according to one or more methods described herein. For example, the circuit package 100 may be manufactured by the method 600 shown in FIG. 7, by the method 700 shown in FIG. 8, by the method 800 shown in FIG. 9, and by the method 900 shown in FIG. 10.

The circuit package 100 includes a photonic interposer 110, a second interposer 120, and a die 130 partially overlapping and connected to both the photonic interposer 110 and the second interposer 120. As shown, the die 130 vertically overlaps both the photonic interposer 110 and the second interposer 120. In accordance with at least one embodiment of the present disclosure, the photonic interposer 110 may be any type of photonic interposer. For example, the photonic interposer 110 may include a photonic integrated circuit.

In some embodiments, the second interposer 120 may be a photonic interposer (e.g., second photonic interposer). One or more photonic interposers (e.g., photonic interposer 110 or second interposer 120), in some embodiments, are photonic integrated circuits. In some embodiments, the second interposer 120 is a non-photonic interposer. Non-photonic interposers, in some embodiments, may include one or more of a silicon (SI) interposer, an SI bridge, electronic interposers, other interposer materials, other bridge materials, or combinations thereof. In some embodiments, the photonic interposer 110 and the second interposer 120 are formed of silicon or a silicon alloy.

In some embodiments, the photonic interposer 110 and the second interposer 120 are adjacent each other. For example, the photonic interposer 110 and the second interposer 120 may be only separated by a space or a spacer (e.g., a mold). The photonic interposer 110 and the second interposer 120, in some embodiments, are directly adjacent. For example, the photonic interposer 110 and the second interposer 120 may be only separated by a space. In some embodiments, the photonic interposer 110 and the second interposer 120 abut each other. For example, the photonic interposer 110 and the second interposer 120 may directly touch.

As shown in FIG. 1, the photonic interposer 110 and the second interposer 120 do not vertically overlap each other. In some embodiments, the photonic interposer 110 and the second interposer 120 at least partially vertically overlap each other.

The die 130 may include any applicable integrated circuit, such as an ASIC, a processor, and ARM processor, an image processor, a tensor engine, a neural-compute engine, a video processor, a general-purpose processor, or combinations thereof. As shown, the die 130 may be larger in at least one dimension than the photonic interposer 110. As shown, the die 130 is larger in the x-direction than the photonic interposer 110. In some embodiments, the die 130 is larger than the photonic interposer 110 in two or more dimensions.

The die 130 may include various portions. For example, the die 130 may include an analog-mixed signal portion 132-1 and/or an electronic portion 132-2. The analog-mixed signal portion 132-1 may include a first processing element 134-1. The first processing element 134-1 may transmit and/or receive data using the photonic interposer 110. For example, the first processing element 134-1 may transmit and/or receive data photonically using the photonic interposer 110. The electronic portion 132-2 may include a second processing element 134-2. The second processing element 134-2 may transmit and/or receive data using the second interposer 120. For example, the second interposer 120 may be an electrical-only interposer (e.g., not a photonic interposer) such that the second processing element 134-2 may transmit and/or receive data electrically using the second interposer 120.

In accordance with at least one embodiment of the present disclosure, the first processing element 134-1 may include processing elements that are configured to communicate with elements of the photonic interposer 110. In some embodiments, information may be communicated with the photonic interposer 110 through a photonic channel of the photonic interposer 110 and is received at an optical-to-electrical (OE) interface between the photonic interposer 110 and analog-mixed signal portion 132-1. The OE interface may be implemented, for example, by a photodetector (e.g., photodiode) in the photonic interposer 110 to convert the optical signal into an electronic signal, in conjunction with related electronic circuitry in the analog-mixed signal portion 132-1, which may include, e.g., a transimpedance amplifier (TIA), optional gain control to normalize the signal level, and slicer to extract the bit stream. The information can then be buffered in electronic form in a register such as "first in first out" (FIFO) register. Similarly, an EO interface can be used in the same photonic channel to send data via the photonic interposer.

The first processing element 134-1 may communicate with the elements of the photonic interposer 110 using any type of connection. For example, the circuit package 100 may include one or more electrical interconnects. The electrical interconnects may be any type of electrical interconnect, including one or more of soldering bumps, wires, copper pillars, wirebonds, through-substrate vias (TSVs), through-dielectric via (TDVs), re-distribution layers (RDLs), landing pads, any other electrical interconnect, and combinations thereof. In some embodiments, the electrical interconnect copper pillar may be embedded in a landing pad. The copper pillar may protrude from the landing pad to connect with a photonic component on the photonic interposer 110. This may electrically couple the electrical component to the photonic component. The landing pad may have a larger surface area than a cross sectional area of the copper pillar. In some embodiments, the copper pillar is electrically connected to a cathode of a modulator. In some embodiments, the landing pad is shaped as a polygon or a circle, and the copper pillar is landed on the landing pad at a position away from a center of the polygon or circle.

As discussed herein, the photonic interposer 110 may include any type of photonic elements. For example, the photonic interposer 110 may include a modulator. The modulator may be any type of modulator discussed herein. For example, the modulator may be a thermally stable modulator. In some examples, the modulator may be an electro-absorption modulator (EAM). The first processing element 134-1 of the analog-mixed signal portion 132-1 of the die 130 may include a driver. The driver may be connected to the modulator. For example, the modulator may be connected to the driver using an electrical interconnect. This may allow the analog-mixed signal portion 132-1 of the die 130 to communicate with the modulator of the photonic interposer 110.

In some examples, the photonic interposer 110 may include a photodetector. The photodetector may be any type of photodetector, such as a photodiode. The first processing element 134-1 of the analog-mixed signal portion 132-1 of the die 130 may include a transimpedance amplifier (TIA).

The TIA and the photodetector may be in communication with an electrical interconnect. This may allow the analog-mixed signal portion 132-1 of the die 130 to communicate with the photonic interposer 110.

As shown in FIG. 2, the die 130 partially overlaps and is connected to both the photonic interposer 110 and the second interposer 120. As shown in FIG. 2, the die 130 vertically overlaps both the photonic interposer 110 and the second interposer 120. The analog-mixed signal portion 132-1 vertically overlaps the photonic interposer 110 and the electronic portion 132-2 vertically overlaps the second interposer 120.

In some embodiments, the photonic interposer 110 is optically connected to the die 130. For example, optical signals may be sent from the photonic interposer 110 and received by the die 130 and/or sent from the die 130 and received by the photonic interposer 110. In embodiments where the second interposer is a photonic interposer, the second interposer 120 is optically connected to the die 130. For example, optical signals may be sent from the second interposer 120 and received by the die 130 and/or sent from the die 130 and received by the second interposer 120.

In embodiments where the second interposer is a non-photonic interposer, the second interposer 120 is electrically connected to the die 130. For example, electrical signals may be sent from the second interposer 120 and received by the die 130 and/or sent from the die 130 and received by the second interposer 120. In some embodiments, the second interposer 120 may include one or more through substrate vias (TSVs) that electrically connect to the die 130. For example, the second interposer 120 may electrically connect to the portion of the die 130 that overlaps the second interposer 120 through the TSVs. In some embodiments, the photonic interposer 110 may include one or more TSVs.

As shown in FIG. 2, the circuit package 100 may optionally include a second die 130-2. The second processing element 134-2 may be configured to communicate with the second die 130-2 through a communication path. The second die 130-2 may be electrically connected to the second interposer 120 over an electronic portion of the communication path. This may allow the second die 130-2 to communicate with the second interposer 120 and/or the photonic interposer 110. In some embodiments, the second die 130-2 may be a third-party die or chip. In some embodiments, the second die 130-2 may be a different type of die or chip than the die 130.

In some embodiments, the second die 130-2 may be electrically connected and/or in electrical communication with the electronic portion 132-2 of the die 130 over the communication path. For example, the second die 130-2 may be electrically connected and/or in electrical communication with the electronic portion 132-2 through the second interposer 120. In some examples, the second die 130-2 may be electrically connected and/or in electrical communication with the electronic portion 132-2 through the communication path that travels through the second interposer 120.

The second die 130-2 may include a third processing element 134-3. The third processing element 134-3 may communicate with the second processing element 134-2 in the electronic portion 132-2 over the communication path. For example, the third processing element 134-3 may receive signals and/or information from the electronic portion 132-2 of the die 130 over the communication path.

In some embodiments, the second die 130-2 may be electrically connected and/or in electrical communication with the analog-mixed signal portion 132-1 of the die 130 over the communication path. For example, the second die 130-2 may be electrically connected and/or in electrical communication with the analog-mixed signal portion 132-1 through the electronic portion 132-2 and the second interposer 120. In some examples, the second die 130-2 may be electrically connected and/or in electrical communication with the analog-mixed signal portion 132-1 through the communication path that travels through the second interposer 120 and the electronic portion 132-2. This may allow the third processing element 134-3 to communicate with the first processing element 134-1 of the analog-mixed signal portion 132-1.

In some embodiments, the second die 130-2 may be electrically connected and/or in electrical communication with the photonic interposer 110 over the communication path. For example, the second die 130-2 may be electrically connected and/or in electrical communication with the photonic interposer 110 through the analog-mixed signal portion 132-1, the electronic portion 132-2, and the second interposer 120. In some examples, the second die 130-2 may be electrically connected and/or in electrical communication with the photonic interposer 110 through the communication path that travels through the second interposer 120, the electronic portion 132-2, and the analog-mixed signal portion 132-1. This may allow the third processing element 134-3 to communicate with the first processing element 134-1 of the analog-mixed signal portion 132-1.

In some embodiments, the second die 130-2 may be optically connected and/or in optical communication with other optical elements of the circuit package 100 (such as an FAU) through the photonic interposer 110 and electrically connected and/or in electrical communication with the photonic interposer 110 over the communication path. For example, the second die 130-2 may optically connected and/or in optical communication with the other optical elements through the photonic interposer 110 and be electrically connected and/or in electrical communication with the photonic interposer 110 through the analog-mixed signal portion 132-1, the electronic portion 132-2, and the second interposer 120. In some examples, the second die 130-2 may be optically connected and/or in optical communication with the other optical elements of the circuit package 100 through an optical portion of the communication path that travels through the photonic interposer 110 and electrically connected and/or in electrical communication with the photonic interposer 110 through the communication path that travels through the second interposer 120, the electronic portion 132-2, and the analog-mixed signal portion 132-1. This may allow the third processing element 134-3 to communicate with the other optical elements.

Figure 3:
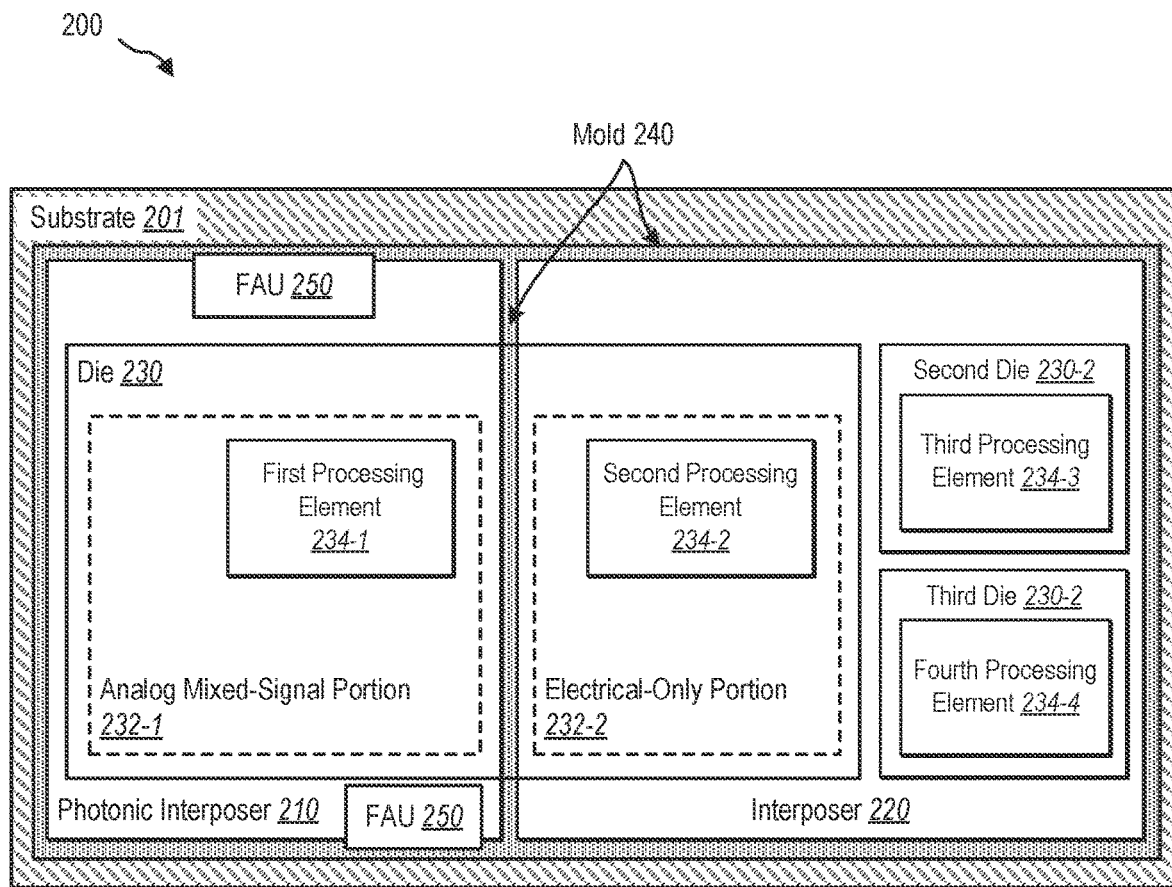
FIG. 3 is a top view of an embodiment of a circuit package, according to at least one embodiment of the present disclosure.

FIG. 3 is a top view of an embodiment of an electrical bridge package with integrated off-bridge photonic channel interface (as used herein circuit package 200). The circuit package 200 may be manufactured according to one or more methods described herein. For example, the circuit package 200 may be manufactured by the method 600 shown in FIG. 7, by the method 700 shown in FIG. 8, by the method 800 shown in FIG. 9, and by the method 900 shown in FIG. 10.

The circuit package 200 includes a photonic interposer 210, a second interposer 220, and a die 230 partially overlapping and connected to both the photonic interposer 210 and the second interposer 220. As shown, the die 230 vertically overlaps both the photonic interposer 210 and the second interposer 220.

In some embodiments, the second interposer 220 may be a photonic interposer (e.g., second photonic interposer). One or more photonic interposers (e.g., photonic interposer 210 or second interposer 220), in some embodiments, are photonic integrated circuits. In some embodiments, the second interposer 220 is a non-photonic interposer. Non-photonic interposers, in some embodiments, may include one or more of a silicon (SI) interposer, an SI bridge, other interposer materials, other bridge materials, or combinations thereof. In some embodiments, the photonic interposer 210 and the second interposer 220 are formed of silicon or a silicon alloy.

In some embodiments, the photonic interposer 210 and the second interposer 220 are adjacent each other. For example, as shown, the photonic interposer 210 and the second interposer 220 may be only separated by a spacer (e.g., optional mold 240). The optional mold 240 may surround one or more lateral surfaces of the photonic interposer 210 and/or the second interposer 220. As shown, the optional mold 240 surrounds the entirety of the lateral surfaces of the photonic interposer 210 and the second interposer 220 including the space between the photonic interposer 210 and the second interposer 220. The photonic interposer 210 and the second interposer 220, in some embodiments, are directly adjacent. For example, the photonic interposer 210 and the second interposer 220 may be only separated by a space not a spacer (e.g., mold 240). In some embodiments, the photonic interposer 210 and the second interposer 220 abut each other. For example, the photonic interposer 210 and the second interposer 220 may directly touch (e.g., no mold 240).

The die 230 may include various portions. For example, the die 230 may include an analog-mixed signal portion 232-1 and/or an electronic portion 232-2. The analog-mixed signal portion 232-1 may include a first processing element 234-1. The first processing element 234-1 may transmit and/or receive data using the photonic interposer 210. For example, the first processing element 234-1 may transmit and/or receive data photonically using the photonic interposer 210. The electronic portion 232-2 may include a second processing element 234-2. The second processing element 234-2 may transmit and/or receive data using the second interposer 220. For example, the second interposer 220 may be an electrical-only interposer (e.g., not a photonic interposer) such that the second processing element 234-2 may transmit and/or receive data electrically using the second interposer 220.

As shown, the circuit package 200 may optionally include a substrate 201 that electrically connects to the photonic interposer 210 and/or the second interposer 220. The circuit package 200, as shown, may optionally include a second die 230-2 and/or a third die 230-3.

The second die 230-2 and/or the third die 230-3 may include one or more of general purpose memory, high bandwidth memory, HBM3, a processor, an image processor, a video processor, and a general purpose processor.

In embodiments where the second interposer 220 is a non-photonic interposer, the second die 230-2 and/or the third die 230-3 are electrically connected to the second interposer 220 by, for example, two or more TSVs. In embodiments where the second interposer 220 is a photonic interposer, the second die 230-2 and/or the third die 230-3 are optically connected to the second interposer 220.

In some embodiments, at least a portion of the second interposer 220 beneath at least one die (e.g., second die 230-2 or third die 230-3) may be a mold (like mold 240). The mold beneath at least one die may include a through mold via and/or a bond via array to facilitate communication with the at least one die.

The circuit package 200, as shown, may optionally include one or more optical elements (e.g., fiber array units 250). The one or more optical elements are optically connected to the photonic interposer 210.

As shown in FIG. 3, the photonic interposer 210 and the second interposer 220 do not vertically overlap each other. In some embodiments, the photonic interposer 210 and the second interposer 220 at least partially vertically overlap each other. The analog-mixed signal portion 232-1 vertically overlaps the photonic interposer 210 and the electronic portion 232-2 vertically overlaps the second interposer 220.

The die 230 may include an ASIC, a processor, an image processor, a video processor, a general-purpose processor, or combinations thereof. As shown, the die 230 may be larger in at least one dimension than the photonic interposer 210. As shown, the die 230 is larger in the x-direction than the photonic interposer 210. In some embodiments, the die 230 is larger than the photonic interposer 210 in two or more dimensions.

Figures 1, 4:
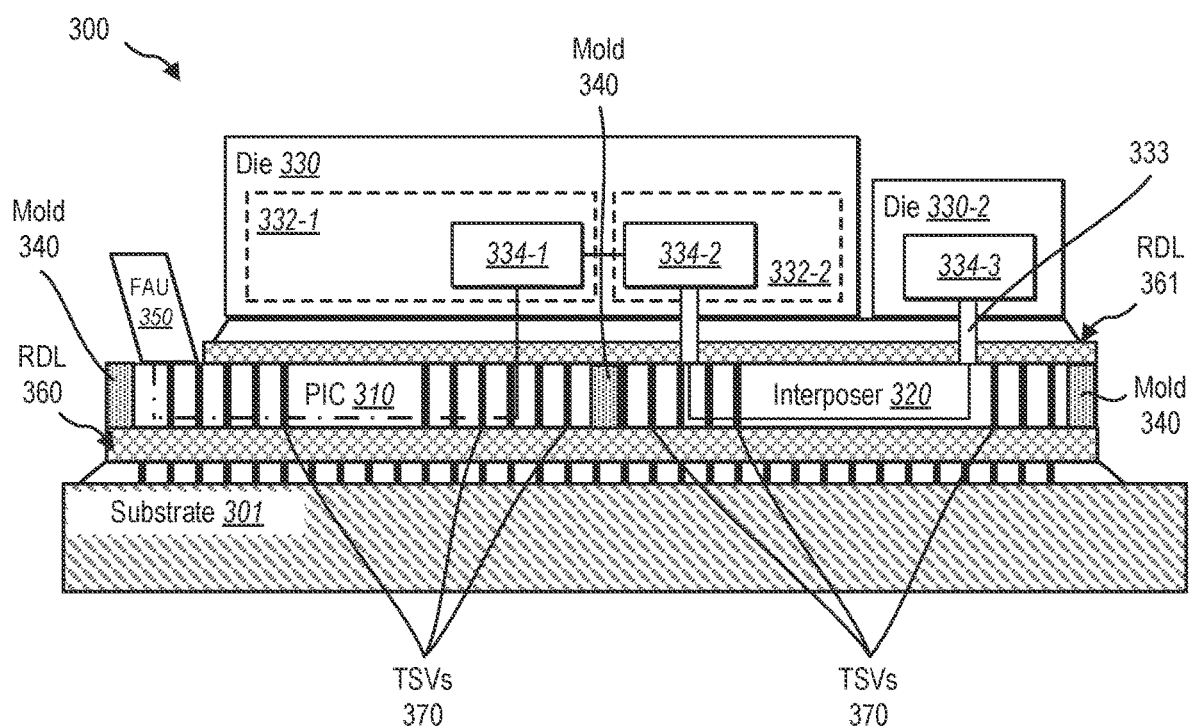
Figures 2, 4:
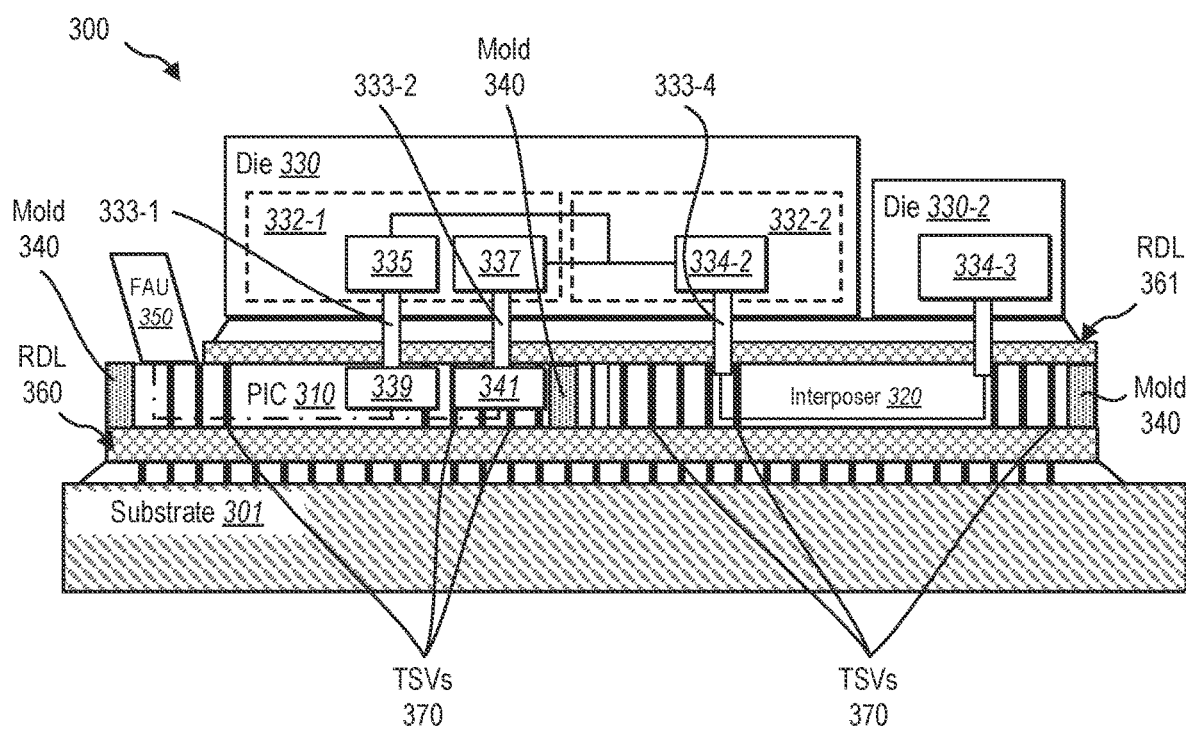
Figures 3, 4:
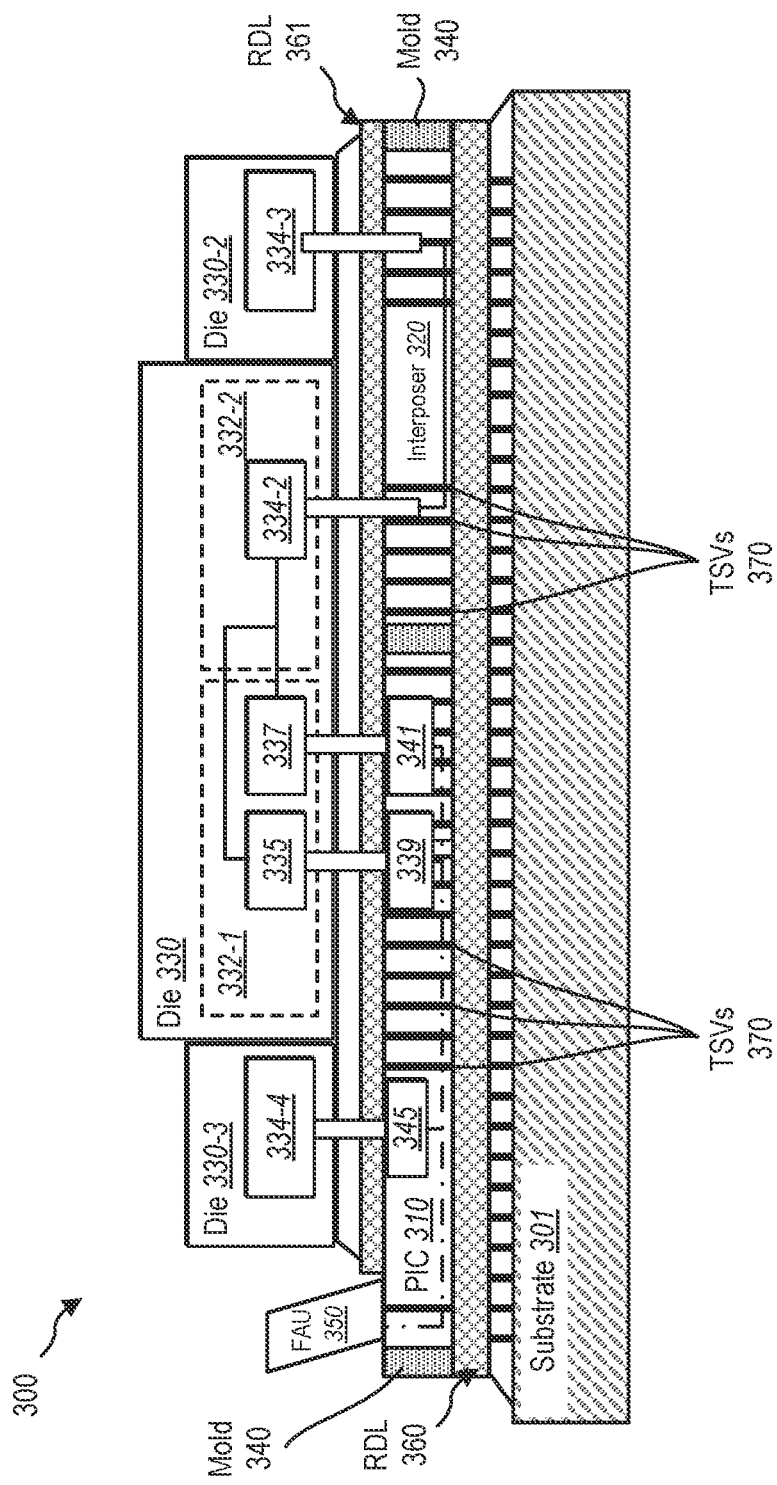

FIG. 4-1 is a cutaway side view of an embodiment of an electrical bridge package with integrated off-bridge photonic channel interface (as used herein circuit package 300). The circuit package 300 may be manufactured according to one or more methods described herein. For example, the circuit package 300 may be manufactured by the method 600 shown in FIG. 7, by the method 700 shown in FIG. 8, and by the method 900 shown in FIG. 10.

As shown in FIG. 4-1, a die 330 partially overlaps and is connected to both a photonic interposer 310 and a second interposer 320. As shown in FIG. 4-1, the die 330 vertically overlaps both the photonic interposer 310 and the second interposer 320.

In some embodiments, the second interposer 320 may be a photonic interposer (e.g., second photonic interposer). One or more photonic interposers (e.g., photonic interposer 310 or second interposer 320), in some embodiments, are photonic integrated circuits. In some embodiments, the second interposer 320 is a non-photonic interposer. Non-photonic interposers, in some embodiments, may include one or more of a silicon (SI) interposer, an SI bridge, other interposer materials, other bridge materials, or combinations thereof. In some embodiments, the photonic interposer 310 and the second interposer 320 are formed of silicon or a silicon alloy.

As shown, the photonic interposer 310 and the second interposer 320 are adjacent each other. For example, as shown, the photonic interposer 310 and the second interposer 320 are only separated by an optional mold 340. The photonic interposer 310 and the second interposer 320, in some embodiments, are directly adjacent. For example, the photonic interposer 310 and the second interposer 320 may be only separated by a space. In some embodiments, the photonic interposer 310 and the second interposer 320 abut each other. For example, the photonic interposer 310 and the second interposer 320 may directly touch (e.g., without optional mold 340).

The die 330 may include various portions. For example, the die 330 may include an analog-mixed signal portion 332-1 and/or an electronic portion 332-2. The analog-mixed signal portion 332-1 may include a first processing element 334-1. The first processing element 334-1 may transmit and/or receive data using the photonic interposer 310. For example, the first processing element 334-1 may transmit and/or receive data photonically using the photonic interposer 310. For example, the first processing element 334-1 may transmit and/or receive data using an electrical interface, as discussed herein. The electronic portion 332-2 may include a second processing element 334-2. The second processing element 334-2 may transmit and/or receive data using the second interposer 320. For example, the second interposer 320 may be an electrical-only interposer (e.g., not a photonic interposer) such that the second processing element 334-2 may transmit and/or receive data electrically using the second interposer 320.

As shown, the circuit package 300 may optionally include a substrate 301 that electrically connects to the photonic interposer 310 and/or the second interposer 320. An optional redistribution layer (RDL) 360 may be applied to the substrate 301 to facilitate electrical connection to the photonic interposer 310 and/or the second interposer 320.

The circuit package 300, as shown, may optionally include a second die 330-2. The second die 330-2 and/or a third die may include one or more of general purpose memory, high bandwidth memory, HBM3, a processor, an image processor, a video processor, and a general purpose processor. The second processing element 334-2 may be configured to communicate with the second die 330-2 through a communication path. The second die 330-2 may include a third processing element 334-3. The third processing element 334-3 may transmit and/or receive data using the second interposer 320. For example, the second interposer 320 may be an electrical-only interposer (e.g., not a photonic interposer) such that the third processing element 334-3 may transmit and/or receive data electrically using the second interposer 320.

As discussed herein, The second die 330-2 may be electrically connected to the second interposer 320 over an electronic portion of the communication path. This may allow the second die 330-2 to communicate with the second interposer 320 and/or the photonic interposer 310. In some embodiments, the second die 330-2 may be a third-party die or chip. In some embodiments, the second die 330-2 may be a different type of die or chip than the die 330.

In some embodiments, the second die 330-2 may be electrically connected and/or in electrical communication with the electronic portion 332-2 of the die 330 over the communication path. For example, the second die 330-2 may be electrically connected and/or in electrical communication with the electronic portion 332-2 through the second interposer 320. In some examples, the second die 330-2 may be electrically connected and/or in electrical communication with the electronic portion 332-2 through the communication path that travels through the second interposer 320.

The second die 330-2 may include a third processing element 334-3. The third processing element 334-3 may communicate with the second processing element 334-2 in the electronic portion 332-2 over the communication path. For example, the third processing element 334-3 may receive signals and/or information from the electronic portion 332-2 of the die 330 over the communication path.

In some embodiments, the second die 330-2 may be electrically connected and/or in electrical communication with the analog-mixed signal portion 332-1 of the die 330 over the communication path. For example, the second die 330-2 may be electrically connected and/or in electrical communication with the analog-mixed signal portion 332-1 through the electronic portion 332-2 and the second interposer 320. In some examples, the second die 330-2 may be electrically connected and/or in electrical communication with the analog-mixed signal portion 332-1 through the communication path that travels through the second interposer 320 and the electronic portion 332-2. This may allow the third processing element 334-3 to communicate with the first processing element 334-1 of the analog-mixed signal portion 332-1.

In some embodiments, the second die 330-2 may be electrically connected and/or in electrical communication with the photonic interposer 310 over the communication path. For example, the second die 330-2 may be electrically connected and/or in electrical communication with the photonic interposer 310 through the analog-mixed signal portion 332-1, the electronic portion 332-2, and the second interposer 320. In some examples, the second die 130-2 may be electrically connected and/or in electrical communication with the photonic interposer 310 through the communication path that travels through the second interposer 320, the electronic portion 332-2, and the analog-mixed signal portion 332-1. This may allow the third processing element 334-3 to communicate with the first processing element 334-1 of the analog-mixed signal portion 332-1.

In some embodiments, the second die 330-2 may be optically connected and/or in optical communication with the FAU 350 through the photonic interposer 310 and electrically connected and/or in electrical communication with the photonic interposer 310 over the communication path. For example, the second die 330-2 may optically connected and/or in optical communication with the FAU 350 through the photonic interposer 310 and be electrically connected and/or in electrical communication with the photonic interposer 310 through the analog-mixed signal portion 332-1, the electronic portion 332-2, and the second interposer 320. In some examples, the second die 330-2 may be optically connected and/or in optical communication with the FAU 350 of the circuit package 300 through an optical portion of the communication path that travels through the photonic interposer 310 and electrically connected and/or in electrical communication with the photonic interposer 310 through the communication path that travels through the second interposer 320, the electronic portion 332-2, and the analog-mixed signal portion 332-1. This may allow the third processing element 334-3 to communicate with the FAU 350.

The second die 330-2 may be connected to the second interposer 320 by an RDL layer 361. The RDL layer 361 may extend under a portion of the second die 330-2, under the entire second die 330-2, over a portion of the second interposer 320, over an entirety of the second interposer 320, under a portion of the photonic interposer 310, over a portion of the optional mold 340, over a portion photonic interposer 310, over a portion of the optional mold 340 and a portion photonic interposer 310, over an entirety of photonic interposer 310, under an entirety of die 330, over a portion of the second interposer 320 and over a portion the optional mold 340 and under a portion of the second die 330-2 and under a portion of the die 330 and over a portion of the photonic interposer 310, or combinations thereof. In embodiments where the RDL layer 361 extends over the photonic interposer 310, portions of the RDL layer 361 may be removed. For example, portions of RDL layer 361 that impede optical communication with the photonic interposer 310 may be at least partially or completely removed from the photonic interposer 310 to facilitate optical communication with the photonic interposer 310.

In embodiments where the second interposer 320 is a non-photonic interposer, the second die 330-2 is electrically connected to the second interposer 320 by, for example, an optional RDL layer 361 and/or one or more TSVs 370. In embodiments where the second interposer 320 is a photonic interposer, the second die 330-2 is optically connected to the second interposer 320.

In some embodiments, at least a portion of the second interposer 320 beneath at least one die (e.g., second die 330-2 or an additional die) may be a mold (like mold 340). The mold beneath at least one die may include a through mold via and/or a bond via array to facilitate communication with the at least one die.

The circuit package 300, as shown, may optionally include one or more optical elements (e.g., fiber array units 350). The one or more optical elements are optically connected to the photonic interposer 310. In some embodiments, the circuit package 300 includes a fiber array unit (FAU) 350 for each photonic interposer 310. In accordance with at least one embodiment of the present disclosure, the FAU 350 is in communication with the photonic interposer 310 using one or more FAU connections that are portions of photonic channels. In some embodiments, the circuit package 300 may include multiple FAUs 350. For example, the circuit package 300 may include multiple FAUs 350 in communication with a single photonic interposer 310. In some examples, the circuit package 300 may include multiple FAUs 250 connected to and/or in communication with different photonic interposers 310.

In accordance with at least one embodiment of the present disclosure, the FAU 350 may be in communication with the photonic interposer 310 through a FAU connection 343. The FAU connection 343 may be any type of connection. For example, the FAU connection 343 may be manufactured to be in an optical coupling with light entering or exiting the photonic interposer via a photonic channel. For example, the FAU connection 343 may be a portion of a bidirectional channel. In some examples, the FAU connection 343 (e.g., the bidirectional channel) may include a waveguide or fiber.

As shown in FIG. 4-1, the photonic interposer 310 and the second interposer 320 do not vertically overlap each other. In some embodiments, the photonic interposer 310 and the second interposer 320 at least partially vertically overlap each other.

The die 330 may include an ASIC, a processor, an image processor, a video processor, a general-purpose processor, or combinations thereof. As shown, the die 330 may be larger in at least one dimension than the photonic interposer 310. As shown, the die 330 is larger in the x-direction than the photonic interposer 310. In some embodiments, the die 330 is larger than the photonic interposer 310 in two or more dimensions.

In some embodiments, the photonic interposer 310 is optically connected to the die 330. For example, optical signals may be sent from the photonic interposer 310 and received by the die 330 and/or sent from the die 330 and received by the photonic interposer 310.

In embodiments where the second interposer 320 is a photonic interposer, the second interposer 320 is optically connected to the die 330 and the second die 330-2. For example, optical signals may be sent from the second interposer 320 and received by the die 330 and the second die 330-2 and/or sent from the die 330 and the second die 330-2 and received by the second interposer 320.

In embodiments where the second interposer is a non-photonic interposer, the second interposer 320 is electrically connected to the die 330 and the second die 330-2. For example, electrical signals may be sent from the second interposer 320 and received by the die 330 and/or the second die 330-2 and/or sent from the die 330 and/or the second die 330-2 and received by the second interposer 320. In some embodiments, the second interposer 320 may include one or more TSVs 370 that electrically connect to the die 330 and the second die 330-2. For example, the second interposer 320 may electrically connect to the portion of the die 330 that overlaps the second interposer 320 and/or the second die 330-2 through the TSVs 370. In some embodiments, the photonic interposer 310 may include one or more TSVs 370.

As discussed herein, the second interposer 320 may be electrically connected to the electronic portion 332-2 of the die 330 with an electrical interconnect 333. The electrical interconnect 333 may be any type of electrical interconnect, including one or more of soldering bumps, wires, copper pillars, wirebonds, through-substrate vias (TSVs), through-dielectric via (TDVs), re-distribution layers (RDLs), landing pads, any other electrical interconnect, and combinations thereof. In some embodiments, the electrical interconnect copper pillar may be embedded in a landing pad. The copper pillar may protrude from the landing pad to connect with a photonic component on the photonic interposer 110. This may electrically couple the electrical component to the photonic component. The landing pad may have a larger surface area than a cross sectional area of the copper pillar. In some embodiments, the copper pillar is electrically connected to a cathode of a modulator. In some embodiments, the landing pad is shaped as a polygon or a circle, and the copper pillar is landed on the landing pad at a position away from a center of the polygon or circle.

The electrical interconnect 333 may have an interconnect length that is the distance between the electronic portion 332-2 and the second interposer 320. The interconnect length may be any value. For example, the interconnect length may be no more than 50 microns, no more than 60 microns, no more than 70 microns, no more than 80 microns, no more than 90 microns, no more than 100 microns, no more than 110 microns, no more than 120 microns, no more than 130 microns, no more than 140 microns, no more than 150 microns, or any value therebetween. As a specific, non-limiting example, the interconnect length may be less than 100 microns to facilitate fast and efficient communication between the electrical component and the photonic component.

The electrical interconnect 333 may have an interconnect diameter. The interconnect diameter may be any value. For example, the interconnect diameter may be 10 microns or less, 15 microns or less, 20 microns or less, 25 microns or less, 30 microns or less, 35 microns or less, 40 microns or less, 45 microns or less, 50 microns or less, or any value therebetween.

FIG. 4-2 is a cutaway side view of an embodiment of a circuit package 300. The circuit package 300 may be manufactured according to one or more methods described herein. For example, the circuit package 300 may be manufactured by the method 600 shown in FIG. 7, by the method 700 shown in FIG. 8, and by the method 900 shown in FIG. 10.

As shown in FIG. 4-2, a die 330 partially overlaps and is connected to both a photonic interposer 310 and a second interposer 320. As shown in FIG. 4-2, the die 330 vertically overlaps both the photonic interposer 310 and the second interposer 320.

The die 330 may include various portions. For example, the die 330 may include an analog-mixed signal portion 332-1 and/or an electronic portion 332-2. The analog-mixed signal portion 332-1 may include one or more processing elements. For example, the analog-mixed signal portion 332-1 may include a driver 335 and/or a transimpedance amplifier (TIA) 337. The processing elements of the analog-mixed signal portion 332 may transmit and/or receive data using the photonic interposer 310.

The photonic interposer 310 may include a modulator 339 and/or a photodetector 341. As discussed herein, the processing elements of the analog-mixed signal portion 332-1, including the driver 335 and the TIA 337, may transmit and/or receive data with the photonic interposer 310. For example, the driver 335 of the analog-mixed signal portion 332-1 may be in communication with the modulator 339 of the photonic interposer 310. The driver 335 of the analog-mixed signal portion 332-1 may be connected to a first end of a first electrical interconnect 333-1. The modulator 339 of the photonic interposer 310 may be connected to a second end of the first electrical interconnect 333-1. In this manner, the driver 335 of the analog-mixed signal portion 332-1 and the modulator 339 of the photonic interposer 310 may be in communication through the first electrical interconnect 333-1.

In some examples, the TIA 337 of the analog-mixed signal portion 332-1 may be in communication with the photodetector 341 of the photonic interposer 310. The TIA 337 of the analog-mixed signal portion 332-1 may be connected to a first end of a second electrical interconnect 333-2. The photodetector 341 of the photonic interposer 310 may be connected to a second end of the second electrical interconnect 333-2. In this manner, the TIA 337 of the analog-mixed signal portion 332-1 and the photodetector 341 of the photonic interposer 310 may be in communication through the second electrical interconnect 333-2.

As shown, the circuit package 300 may optionally include a substrate 301 that electrically connects to the photonic interposer 310 and/or the second interposer 320. An optional redistribution layer (RDL) 360 may be applied to the substrate 301 to facilitate electrical connection to the photonic interposer 310 and/or the second interposer 320.

The circuit package 300, as shown, may optionally include a second die 330-2. The second die 330-2 may include one or more of general purpose memory, high bandwidth memory, HBM3, a processor, an image processor, a video processor, and a general purpose processor. The second die 330-2 may include a second electronic portion (similar to the electronic portion 332-2) of the die 330. The second electronic portion may include one or more processing elements that may be configured to communicate with the second interposer 320 through a communication path. The second electronic portion may transmit and/or receive data using the second interposer 320. For example, the second interposer 320 may be an electrical-only interposer (e.g., not a photonic interposer) such that the second electronic portion may transmit and/or receive data electrically using the second interposer 320.

As discussed herein, The second die 330-2 may be electrically connected to the second interposer 320 over an electronic portion of a communication path. This may allow the second die 330-2 to communicate with the second interposer 320 and/or the photonic interposer 310. In some embodiments, the second die 330-2 may be a third-party die or chip. In some embodiments, the second die 330-2 may be a different type of die or chip than the die 330.

In some embodiments, the second die 330-2 may be electrically connected and/or in electrical communication with the electronic portion 332-2 of the die 330 over the communication path. For example, the second die 330-2 may be electrically connected and/or in electrical communication with the electronic portion 332-2 through the second interposer 320. In some examples, the second die 330-2 may be electrically connected and/or in electrical communication with the electronic portion 332-2 through the communication path that travels through the second interposer 320.

The second die 330-2 may include a third processing element 334-3. The third processing element 334-3 may communicate with the second processing element 334-2 in the electronic portion 332-2 over the communication path. For example, the third processing element 334-3 may receive signals and/or information from the electronic portion 332-2 of the die 330 over the communication path.

In some embodiments, the second die 330-2 may be electrically connected and/or in electrical communication with the analog-mixed signal portion 332-1 of the die 330 over the communication path. For example, the second die 330-2 may be electrically connected and/or in electrical communication with the analog-mixed signal portion 332-1 through the electronic portion 332-2 and the second interposer 320. In some examples, the second die 330-2 may be electrically connected and/or in electrical communication with the analog-mixed signal portion 332-1 through the communication path that travels through the second interposer 320 and the electronic portion 332-2. This may allow the third processing element 334-3 to communicate with the first processing elements the analog-mixed signal portion 332-1, such as the driver 335 and/or the TIA 337.

In some embodiments, the second die 330-2 may be electrically connected and/or in electrical communication with the photonic interposer 310 over the communication path. For example, the second die 330-2 may be electrically connected and/or in electrical communication with the photonic interposer 310 through the analog-mixed signal portion 332-1 (including the driver 335 and/or the TIA 337), the electronic portion 332-2, and the second interposer 320. In some examples, the second die 130-2 may be electrically connected and/or in electrical communication with the photonic interposer 310 through the communication path that travels through the second interposer 320, the electronic portion 332-2, and the analog-mixed signal portion 332-1. In some examples, the second die 130-2 may be electrically connected and/or in electrically communication with the photonic interposer 310 through the modulator 339 and/or the photodetector 341 of the photonic interposer 310.

In some embodiments, the second die 330-2 may be optically connected and/or in optical communication with the FAU 350 through the photonic interposer 310 and electrically connected and/or in electrical communication with the photonic interposer 310 over the communication path. For example, the second die 330-2 may optically connected and/or in optical communication with the FAU 350 through the photonic interposer 310 and be electrically connected and/or in electrical communication with the photonic interposer 310 through the analog-mixed signal portion 332-1, the electronic portion 332-2, and the second interposer 320. In some examples, the second die 330-2 may be optically connected and/or in optical communication with the FAU 350 of the circuit package 300 through an optical portion of the communication path that travels through the photonic interposer 310 and electrically connected and/or in electrical communication with the photonic interposer 310 through the communication path that travels through the second interposer 320, the electronic portion 332-2, and the analog-mixed signal portion 332-1. This may allow the third processing element 334-3 to communicate with the FAU 350.

The second die 330-2 may be connected to the second interposer 320 by an RDL layer 361. The RDL layer 361 may extend under a portion of the second die 330-2, under the entire second die 330-2, over a portion of the second interposer 320, over an entirety of the second interposer 320, under a portion of the photonic interposer 310, over a portion of the optional mold 340, over a portion photonic interposer 310, over a portion of the optional mold 340 and a portion photonic interposer 310, over an entirety of photonic interposer 310, under an entirety of die 330, over a portion of the second interposer 320 and over a portion the optional mold 340 and under a portion of the second die 330-2 and under a portion of the die 330 and over a portion of the photonic interposer 310, or combinations thereof. In embodiments where the RDL layer 361 extends over the photonic interposer 310, portions of the RDL layer 361 may be removed. For example, portions of RDL layer 361 that impede optical communication with the photonic interposer 310 may be at least partially or completely removed from the photonic interposer 310 to facilitate optical communication with the photonic interposer 310.

In embodiments where the second interposer 320 is a non-photonic interposer, the second die 330-2 is electrically connected to the second interposer 320 by, for example, an optional RDL layer 361 and/or one or more TSVs 370. In embodiments where the second interposer 320 is a photonic interposer, the second die 330-2 is optically connected to the second interposer 320.

In some embodiments, at least a portion of the second interposer 320 beneath at least one die (e.g., second die 330-2 or an additional die) may be a mold (like mold 340). The mold beneath at least one die may include a through mold via and/or a bond via array to facilitate communication with the at least one die.

FIG. 4-3 is a cutaway side view of an embodiment of a circuit package 300. The circuit package 300 may be manufactured according to one or more methods described herein. For example, the circuit package 300 may be manufactured by the method 600 shown in FIG. 7, by the method 700 shown in FIG. 8, and by the method 900 shown in FIG. 10.

As shown in FIG. 4-3, a die 330 partially overlaps and is connected to both a photonic interposer 310 and a second interposer 320. As shown in FIG. 4-3, the die 330 vertically overlaps both the photonic interposer 310 and the second interposer 320.

The die 330 may include various portions. For example, the die 330 may include an analog-mixed signal portion 332-1 and/or an electronic portion 332-2. The analog-mixed signal portion 332-1 may include one or more processing elements. For example, the analog-mixed signal portion 332-1 may include a driver 335 and/or a transimpedance amplifier (TIA) 337. The processing elements of the analog-mixed signal portion 332-1 may transmit and/or receive data using the photonic interposer 310.

The photonic interposer 310 may include a modulator 339-1 and/or a photodetector 341. As discussed herein, the processing elements of the analog-mixed signal portion 332-1, including the driver 335 and the TIA 337, may transmit and/or receive data with the photonic interposer 310. For example, the driver 335 of the analog-mixed signal portion 332-1 may be in communication with the modulator 339 of the photonic interposer 310. The driver 335 of the analog-mixed signal portion 332-1 may be connected to a first end of a first electrical interconnect 333-1. The modulator 339 of the photonic interposer 310 may be connected to a second end of the first electrical interconnect 333-1. In this manner, the driver 335 of the analog-mixed signal portion 332-1 and the modulator 339 of the photonic interposer 310 may be in communication through the first electrical interconnect 333-1.

In some examples, the TIA 337 of the analog-mixed signal portion 332-1 may be in communication with the photodetector 341 of the photonic interposer 310. The TIA 337 of the analog-mixed signal portion 332-1 may be connected to a first end of a second electrical interconnect 333-2. The photodetector 341 of the photonic interposer 310 may be connected to a second end of the second electrical interconnect 333-2. In this manner, the TIA 337 of the analog-mixed signal portion 332-1 and the photodetector 341 of the photonic interposer 310 may be in communication through the second electrical interconnect 333-2.

As shown, the circuit package 300 may optionally include a substrate 301 that electrically connects to the photonic interposer 310 and/or the second interposer 320. An optional redistribution layer (RDL) 360 may be applied to the substrate 301 to facilitate electrical connection to the photonic interposer 310 and/or the second interposer 320.

The circuit package 300, as shown, may optionally include a second die 330-2. The second die 330-2 may include one or more of general purpose memory, high bandwidth memory, HBM3, a processor, an image processor, a video processor, and a general purpose processor. The second die 330-2 may include a second analog-mixed signal portion (similar to the analog-mixed signal portion 332-1) of the die 330. The second analog-mixed signal portion may include one or more processing elements that may be configured to communicate with the photonic interposer 310 through a communication path. The second analog-mixed signal portion may transmit and/or receive data using the photonic interposer 310. For example, the photonic interposer 310 may be a photonic integrated circuit (PIC) such that the second analog-mixed signal portion may transmit and/or receive data electrically using the photonic interposer 310.

In some embodiments, the second die 330-2 may be electrically connected and/or in electrical communication with the analog-mixed signal portion 332-1 of the die 330 over the communication path. For example, the second die 330-2 may be electrically connected and/or in electrical communication with the analog-mixed signal portion 332-1 through the electronic portion 332-2 and the second interposer 320. In some examples, the second die 330-2 may be electrically connected and/or in electrical communication with the analog-mixed signal portion 332-1 through the communication path that travels through the second interposer 320 and the electronic portion 332-2. This may allow the third processing element 334-3 to communicate with the first processing elements the analog-mixed signal portion 332-1, such as the driver 335 and/or the TIA 337.

In some embodiments, the second die 330-2 may be electrically connected and/or in electrical communication with the photonic interposer 310 over the communication path. For example, the second die 330-2 may be electrically connected and/or in electrical communication with the photonic interposer 310 through the analog-mixed signal portion 332-1 (including the driver 335 and/or the TIA 337), the electronic portion 332-2, and the second interposer 320. In some examples, the second die 130-2 may be electrically connected and/or in electrical communication with the photonic interposer 310 through the communication path that travels through the second interposer 320, the electronic portion 332-2, and the analog-mixed signal portion 332-1. In some examples, the second die 130-2 may be electrically connected and/or in electrically communication with the photonic interposer 310 through the modulator 339 and/or the photodetector 341 of the photonic interposer 310.

In some embodiments, the second die 330-2 may be optically connected and/or in optical communication with the FAU 350 through the photonic interposer 310 and electrically connected and/or in electrical communication with the photonic interposer 310 over the communication path. For example, the second die 330-2 may optically connected and/or in optical communication with the FAU 350 through the photonic interposer 310 and be electrically connected and/or in electrical communication with the photonic interposer 310 through the analog-mixed signal portion 332-1, the electronic portion 332-2, and the second interposer 320. In some examples, the second die 330-2 may be optically connected and/or in optical communication with the FAU 350 of the circuit package 300 through an optical portion of the communication path that travels through the photonic interposer 310 and electrically connected and/or in electrical communication with the photonic interposer 310 through the communication path that travels through the second interposer 320, the electronic portion 332-2, and the analog-mixed signal portion 332-1. This may allow the third processing element 334-3 to communicate with the FAU 350.

As may be seen, the circuit package 300 may further include a third die 330-3. The third die 330-3 may include a fourth processing element 334-4. The third die 330-3 may connected to the photonic interposer 310. For example, the fourth processing element 334-4 may be in communication with optical elements 345 of the photonic interposer 310. For example, the fourth processing element 334-4 may include a driver and a TIA in communication with the optical elements 345 including a modulator and a photodetector, respectively of the photonic interposer 310. The communication path may include an optical connection between the third die 330-3 and the die 330. For example, the optical elements 345 may be in optical communication with the modulator 339 and the photodetector 341 that are connected to the driver 335 and the 337 of the analog-mixed signal portion 332-1. This may allow the third die 330-3 to be in communication with the die 330 and/or the second die 330-2. The third die 330-3 may be an optical die, or a die that includes optical elements to communicate with the photonic interposer 310.

The second die 330-2 and/or the third die 330-3 may be connected to the photonic interposer 310 by an RDL layer 361. The RDL layer 361 may extend under a portion of the second die 330-2, under the entire second die 330-2, over a portion of the photonic interposer 310, over an entirety of the photonic interposer 310, under a portion of the second interposer 320, over a portion of the optional mold 340, over a portion of the second interposer 320, over a portion of the optional mold 340 and a portion of the second interposer 320, over an entirety of the second interposer 320, under an entirety of die 330, over a portion of the photonic interposer 310 and over a portion the optional mold 340 and under a portion of the second die 330-2 and under a portion of the die 330 and over a portion of the second interposer 320, or combinations thereof. In embodiments where the RDL layer 361 extends over the photonic interposer 310, portions of the RDL layer 361 may be removed. For example, portions of RDL layer 361 that impede optical communication with the photonic interposer 310 may be at least partially or completely removed from the photonic interposer 310 to facilitate optical communication with the photonic interposer 310.

Figure 5:
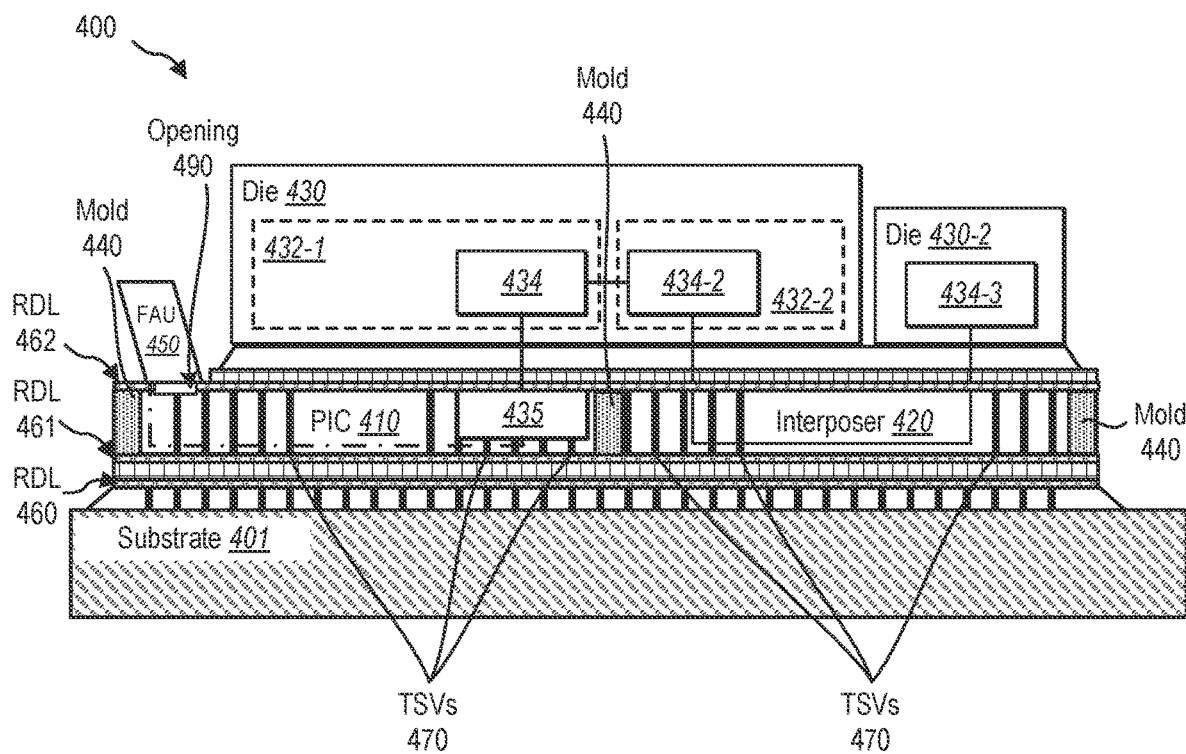
FIG. 5 is a cutaway side view of an embodiment of a circuit package, according to at least one embodiment of the present disclosure.

FIG. 5 is a cutaway side view of an embodiment of an electrical bridge package with integrated off-bridge photonic channel interface (as used herein circuit package 400). The circuit package 400 may be manufactured according to one or more methods described herein. For example, the circuit package 4F00 may be manufactured by the method 600 shown in FIG. 7 and by the method 800 shown in FIG. 9.

As shown in FIG. 5, a die 430 partially overlaps and is connected to both a photonic interposer 410 and a second interposer 420. As shown in FIG. 5, the die 430 vertically overlaps both the photonic interposer 410 and the second interposer 420.

In some embodiments, the second interposer 420 may be a photonic interposer (e.g., second photonic interposer). One or more photonic interposers (e.g., photonic interposer 410 or second interposer 420), in some embodiments, are photonic integrated circuits. In some embodiments, the second interposer 420 is a non-photonic interposer. Non-photonic interposers, in some embodiments, may include one or more of a silicon (SI) interposer, an SI bridge, other interposer materials, other bridge materials, or combinations thereof. In some embodiments, the photonic interposer 410 and the second interposer 420 are formed of silicon or a silicon alloy.

As shown, the photonic interposer 410 and the second interposer 420 are adjacent each other. For example, as shown, the photonic interposer 410 and the second interposer 420 are only separated by an optional mold 440. The photonic interposer 410 and the second interposer 420, in some embodiments, are directly adjacent. For example, the photonic interposer 410 and the second interposer 420 may be only separated by a space. In some embodiments, the photonic interposer 410 and the second interposer 420 abut each other. For example, the photonic interposer 410 and the second interposer 420 may directly touch (e.g., without optional mold 440).

The die 430 may include various portions. For example, the die 430 may include an analog-mixed signal portion 432-1 and/or an electronic portion 432-2. The analog-mixed signal portion 432-1 may include a first processing element 434-1. The first processing element 434-1 may transmit and/or receive data using the photonic interposer 410. For example, the first processing element 434-1 may transmit and/or receive data photonically using the photonic interposer 410. The electronic portion 432-2 may include a second processing element 434-2. The second processing element 434-2 may transmit and/or receive data using the second interposer 420. For example, the second interposer 420 may be an electrical-only interposer (e.g., not a photonic interposer) such that the second processing element 434-2 may transmit and/or receive data electrically using the second interposer 420.

As shown, the circuit package 400 may optionally include a substrate 401 that electrically connects to the photonic interposer 410 and/or the second interposer 420. An optional RDL layer 460 may be applied to the substrate 401 to facilitate electrical connection to the photonic interposer 410 and/or the second interposer 420. An additional optional RDL layer 461 may be applied above the first RDL layer 460 to the substrate 401 to facilitate electrical connection to the photonic interposer 410 and/or the second interposer 420.

The circuit package 400, as shown, may optionally include a second die 430-2. The second die 430-2 and/or the third die 430-3 may include one or more of general purpose memory, high bandwidth memory, HBM3, a processor, an image processor, a video processor, and a general purpose processor. The second processing element 434-2 may be configured to communicate with the second die 430-2 through a communication path (shown in red). The second die 430-2 may include a third processing element 434-3. The third processing element 434-3 may transmit and/or receive data using the second interposer 420. For example, the second interposer 420 may be an electrical-only interposer (e.g., not a photonic interposer) such that the third processing element 434-3 may transmit and/or receive data electrically using the second interposer 420.

As discussed herein, The second die 430-2 may be electrically connected to the second interposer 420 over an electronic portion of the communication path. This may allow the second die 430-2 to communicate with the second interposer 420 and/or the photonic interposer 410. In some embodiments, the second die 430-2 may be a third-party die or chip. In some embodiments, the second die 430-2 may be a different type of die or chip than the die 430.

In some embodiments, the second die 430-2 may be electrically connected and/or in electrical communication with the electronic portion 432-2 of the die 430 over the communication path. For example, the second die 430-2 may be electrically connected and/or in electrical communication with the electronic portion 432-2 through the second interposer 420. In some examples, the second die 430-2 may be electrically connected and/or in electrical communication with the electronic portion 432-2 through the communication path that travels through the second interposer 420.

The second die 430-2 may include a third processing element 434-3. The third processing element 434-3 may communicate with the second processing element 434-2 in the electronic portion 432-2 over the communication path. For example, the third processing element 434-3 may receive signals and/or information from the electronic portion 432-2 of the die 430 over the communication path.

In some embodiments, the second die 430-2 may be electrically connected and/or in electrical communication with the analog-mixed signal portion 432-1 of the die 430 over the communication path. For example, the second die 430-2 may be electrically connected and/or in electrical communication with the analog-mixed signal portion 432-1 through the electronic portion 432-2 and the second interposer 420. In some examples, the second die 430-2 may be electrically connected and/or in electrical communication with the analog-mixed signal portion 432-1 through the communication path that travels through the second interposer 420 and the electronic portion 432-2. This may allow the third processing element 434-3 to communicate with the first processing element 434-1 of the analog-mixed signal portion 432-1.

In some embodiments, the second die 430-2 may be electrically connected and/or in electrical communication with optical elements 445 of the photonic interposer 410 over the communication path. For example, the second die 430-2 may be electrically connected and/or in electrical communication with the photonic interposer 410 through the analog-mixed signal portion 432-1, the electronic portion 432-2, and the second interposer 420. In some examples, the second die 430-2 may be electrically connected and/or in electrical communication with the photonic interposer 410 through the communication path that travels through the second interposer 420, the electronic portion 432-2, and the analog-mixed signal portion 432-1. This may allow the third processing element 434-3 to communicate with the optical elements 445 of the photonic interposer 410.

In some embodiments, the second die 430-2 may be optically connected and/or in optical communication with the FAU 450 through the photonic interposer 410 and electrically connected and/or in electrical communication with the photonic interposer 410 over the communication path. For example, the second die 430-2 may optically connected and/or in optical communication with the FAU 450 through the photonic interposer 410 and be electrically connected and/or in electrical communication with the photonic interposer 410 through the analog-mixed signal portion 432-1, the electronic portion 432-2, and the second interposer 420. In some examples, the second die 430-2 may be optically connected and/or in optical communication with the FAU 450 of the circuit package 400 through an optical portion of the communication path that travels through the photonic interposer 410 and electrically connected and/or in electrical communication with the photonic interposer 410 through the communication path that travels through the second interposer 420, the electronic portion 432-2, and the analog-mixed signal portion 432-1. This may allow the third processing element 434-3 to communicate with the FAU 450.

The second die 430-2 may be connected to the second interposer 420 by an optional RDL layer 462. The RDL layer 462 may extend under a portion of the second die 430-2, under the entire second die 430-2, over a portion of the second interposer 420, over an entirety of the second interposer 420, under a portion of the photonic interposer 410, over a portion of the optional mold 440, over a portion photonic interposer 410, over a portion of the optional mold 440 and a portion photonic interposer 410, over an entirety of photonic interposer 410, under an entirety of die 430, over a portion of the second interposer 420 and over a portion the optional mold 440 and under a portion of the second die 430-2 and under a portion of the die 430 and over a portion of the photonic interposer 410, or combinations thereof.

The RDL layer 462 and/or the second interposer 420 may combine with the photonic interposer 410 to create high precision pads. For example, because the die 430 overlaps both the photonic interposer 410 and the second interposer 420, the connection (e.g., RDL layer 462) between the die 430 and the photonic interposer 410 and between the die 430 and the second interposer 420 may require high levels of precision. The high precision pads may include a top surface that is substantially the same vertical height over the photonic interposer 410 and second interposer 420. The high precision pads may remove one or more the tolerance issues between photonic interposer 410 and second interposer 420 in one or more of the X-direction, the Y-direction, and the vertical direction.

In embodiments where the RDL layer 462 extends over the photonic interposer 410, portions of the RDL layer 462 may be removed. For example, portions of RDL layer 462 that impede optical communication with the photonic interposer 410 may be at least partially or completely removed from the photonic interposer 410 to facilitate optical communication with the photonic interposer 410.

In embodiments where the second interposer 420 is a non-photonic interposer, the second die 430-2 is electrically connected to the second interposer 420 by, for example, an optional RDL layer 462 and/or one or more TSVs 470. In embodiments where the second interposer 420 is a photonic interposer, the second die 430-2 is optically connected to the second interposer 420.

The circuit package 400, as shown, may optionally include one or more optical elements (e.g., fiber array units 450). The one or more optical elements are optically connected to the photonic interposer 410. As shown in FIG. 5, the RDL 462 is removed beneath the one or more fiber array units 450 to form, for example, optional opening 490.

In some embodiments, at least a portion of the second interposer 420 beneath at least one die (e.g., second die 430-2 or an additional die) may be a mold. The mold beneath at least one die may include a through mold via and/or a bond via array to facilitate communication with the at least one die.

As shown in FIG. 5, the photonic interposer 410 and the second interposer 420 do not vertically overlap each other. In some embodiments, the photonic interposer 410 and the second interposer 420 at least partially vertically overlap each other.

The die 430 may include an ASIC, a processor, an image processor, a video processor, a general-purpose processor, or combinations thereof. As shown, the die 430 may be larger in at least one dimension than the photonic interposer 410. As shown, the die 430 is larger in the x-direction than the photonic interposer 410. In some embodiments, the die 430 is larger than the photonic interposer 410 in two or more dimensions.

In some embodiments, the photonic interposer 410 is optically connected to the die 430. For example, optical signals may be sent from the photonic interposer 410 and received by the die 430 and/or sent from the die 430 and received by the photonic interposer 410.

In embodiments where the second interposer 420 is a photonic interposer, the second interposer 420 is optically connected to the die 430 and the second die 430-2. For example, optical signals may be sent from the second interposer 420 and received by the die 430 and the second die 430-2 and/or sent from the die 430 and the second die 430-2 and received by the second interposer 420.

In embodiments where the second interposer is a non-photonic interposer, the second interposer 420 is electrically connected to the die 430 and the second die 430-2. For example, electrical signals may be sent from the second interposer 420 and received by the die 430 and/or the second die 430-2 and/or sent from the die 430 and/or the second die 430-2 and received by the second interposer 420. In some embodiments, the second interposer 420 may include one or more TSVs 470 that electrically connect to the die 430 and the second die 430-2. For example, the second interposer 420 may electrically connect to the portion of the die 430 that overlaps the second interposer 420 and/or the second die 430-2 through the TSVs 470. In some embodiments, the photonic interposer 410 may include one or more TSVs 470.

Figure 6:
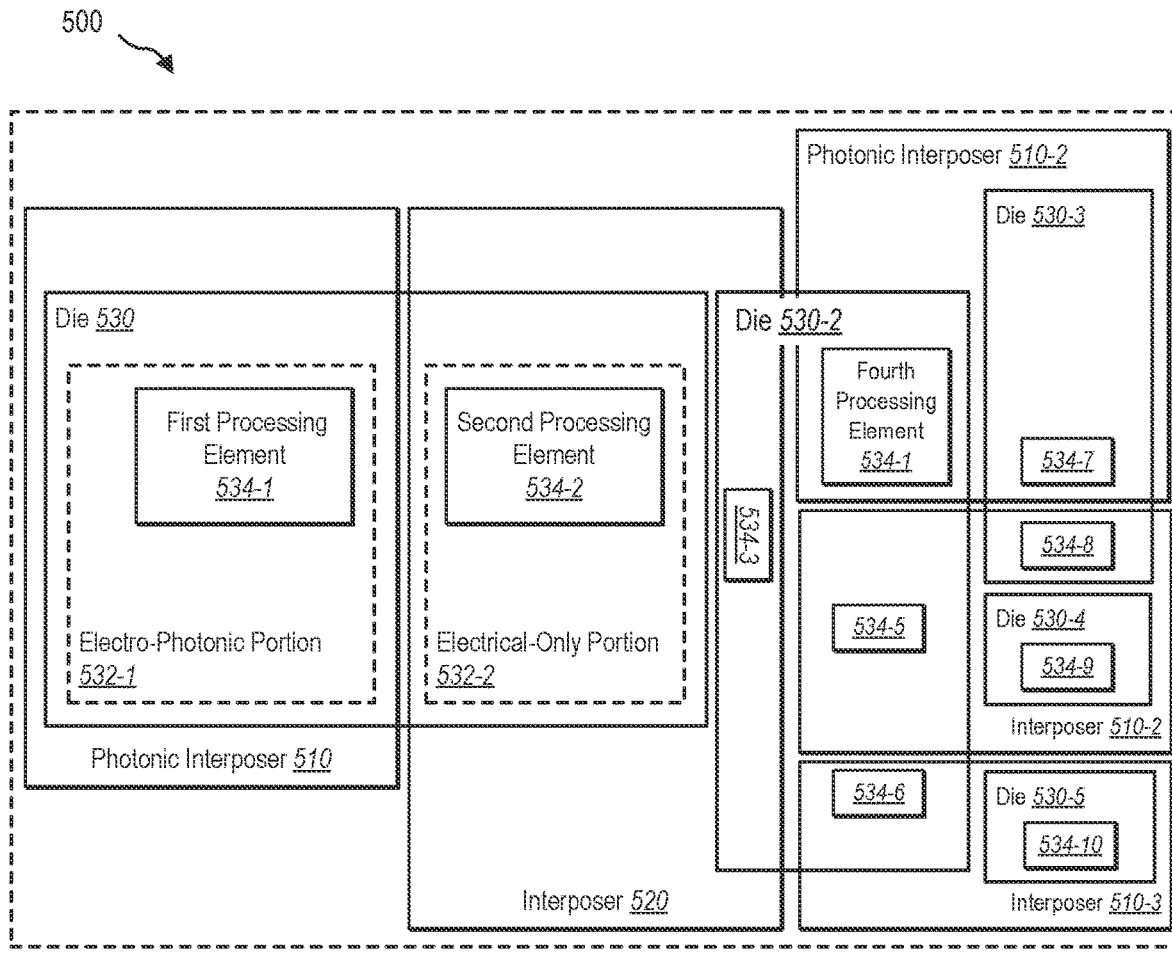
FIG. 6 is a top view of an embodiment of a circuit package, according to at least one embodiment of the present disclosure.

FIG. 6 is a top view of an embodiment of an electrical bridge package with integrated off-bridge photonic channel interface (as used herein circuit package 500). The circuit package 500 may be manufactured according to one or more methods described herein. For example, the circuit package 500 may be manufactured by the method 600 shown in FIG. 7, by the method 700 shown in FIG. 8, by the method 800 shown in FIG. 9, and by the method 900 shown in FIG. 10.

The circuit package 500 includes multiple photonic interposers (e.g., photonic interposer 510, second photonic interposer 510-2, and third photonic interposer 510-3), multiple additional interposers (e.g., second interposer 520 and third interposer 520-2), and multiple dies (e.g., die 530, second die 530-2, third die 530-3, fourth die 530-4, fifth die 530-5, sixth die 530-6). One or more of the multiple dies may partially overlap and be connected to one or more of the multiple photonic interposers and/or one or more of the multiple additional interposers.

The multiple dies may include one or more portions. The die 530 includes an analog-mixed signal portion 532-1 and an electronic portion 532-2. The analog-mixed signal portion 532-1 may include a first processing element 534-1. The first processing element 534-1 may transmit and/or receive data using the photonic interposer 510. For example, the first processing element 534-1 may transmit and/or receive data photonically using the photonic interposer 510. The electronic portion 532-2 may include a second processing element 534-2. The second processing element 534-2 may transmit and/or receive data using the second interposer 520. For example, the second interposer 520 may be an electrical-only interposer (e.g., not a photonic interposer) such that the second processing element 534-2 may transmit and/or receive data electrically using the second interposer 520.

The second die 530-2 includes multiple portions. For example, the second die 530-2 is shown with an electronic portion over the second interposer 520 with a third processing element 534-3 which may transmit and/or receive data photonically using the second interposer 520, shown with an analog-mixed signal portion over the second photonic interposer 510-2 with a fourth processing element 534-4 which may transmit and/or receive data photonically using the second photonic interposer 510-2, shown with an electronic portion over the third interposer 520-2 with a fifth processing element 534-5 which may transmit and/or receive data electrically using the third interposer 520-2, and shown with an analog-mixed signal portion over the third photonic interposer 510-3 with a sixth processing element 534-6 which may transmit and/or receive data photonically using the third photonic interposer 510-3. The third die 530-3 includes an analog-mixed signal portion over the second photonic interposer 510-2 with a seventh processing element 534-7 which may transmit and/or receive data photonically using the second photonic interposer 510-2 and an electronic portion over the third interposer 520-2 with an eighth processing element 534-8 which may transmit and/or receive data electrically using the third interposer 520-2. The fourth die 530-4 only includes an electronic portion over the third interposer 520-2 with a ninth processing element 534-9 which may transmit and/or receive data electrically using the third interposer 520-2. The fifth die 530-5 only includes an analog-mixed signal portion over the third photonic interposer 510-3 with a tenth processing element 534-10 which may transmit and/or receive data photonically using the third photonic interposer 510-3. More or fewer dies with more or fewer portions and/or more or fewer processing elements that interact with more or fewer interposers (electro-photonic, electrical-only, or otherwise) may be used. All combinations are contemplated.

As shown, the die 530 vertically overlaps both the photonic interposer 510 and the second interposer 520. The second die 530-2 vertically overlaps the second interposer 520, the second photonic interposer 510-2, the third photonic interposer 510-3, and the third interposer 520-2. Overlapping multiple interposers may facilitate communication between one or more components while reducing the cost of a photonic interposer sized to connect to all of the multiple dies (e.g., the size of the dotted box surrounding all of the interposers).

In some embodiments, the multiple additional interposers (e.g., second interposer 520 and third interposer 520-2) may be a photonic interposer (e.g., second photonic interposer). One or more photonic interposers (e.g., photonic interposer 510, second photonic interposer 510-2, third photonic interposer 510-3, second interposer 520, and third interposer 520-2), in some embodiments, are photonic integrated circuits. In some embodiments, one or more of the multiple additional interposers (e.g., second interposer 520 and third interposer 520-2) are a non-photonic interposer. Non-photonic interposers, in some embodiments, may include one or more of a silicon (SI) interposer, an SI bridge, other interposer materials, other bridge materials, or combinations thereof. In some embodiments, one or more of the multiple photonic interposers and/or one or more of the multiple additional interposers are formed of silicon or a silicon alloy.

In some embodiments, one or more of the multiple photonic interposers and/or one or more of the multiple additional interposers are adjacent each other. For example, one or more of the multiple photonic interposers and/or one or more of the multiple additional interposers may be only separated by a space or a spacer (e.g., a mold). The one or more of the multiple photonic interposers and/or one or more of the multiple additional interposers, in some embodiments, are directly adjacent. For example, the one or more of the multiple photonic interposers and/or one or more of the multiple additional interposers may be only separated by a space. In some embodiments, the photonic one or more of the multiple photonic interposers and/or one or more of the multiple additional interposers abut each other. For example, one or more of the multiple photonic interposers and/or one or more of the multiple additional interposers may directly touch. In some embodiments, two or more interposers may be adjacent, two or more interposers may be directly adjacent, two or more interposers may abut, or combinations thereof.

As shown in FIG. 5, one or more of the multiple photonic interposers and/or one or more of the multiple additional interposers do not vertically overlap each other. In some embodiments, one or more of the multiple photonic interposers and/or one or more of the multiple additional interposers at least partially vertically overlap each other.

The multiple dies may include an ASIC, a processor, an image processor, a video processor, a general-purpose processor, or combinations thereof. The multiple die may be larger in at least one dimension than one or more of the multiple photonic interposers and/or one or more of the multiple additional interposers. As shown, the die 530 is larger in the x-direction than the photonic interposer 510 and the second die 530-2 is larger than the second interposer 520-2 in its entirety. In some embodiments, one or more of the multiple die are larger than one or more of the multiple photonic interposers and/or one or more of the multiple interposers in two or more dimensions.

In some embodiments, the circuit package 500 may include one or more optical elements, a substrate, various RDL layers, openings in one or more RDL layers, TSVs, any other component described herein, or combinations thereof.

The one or more RDL layers described herein may be ten microns line per inch, may be less than two microns in the vertical direction, may be less than two layers thick in the vertical direction, or combinations thereof.

Figure 7:
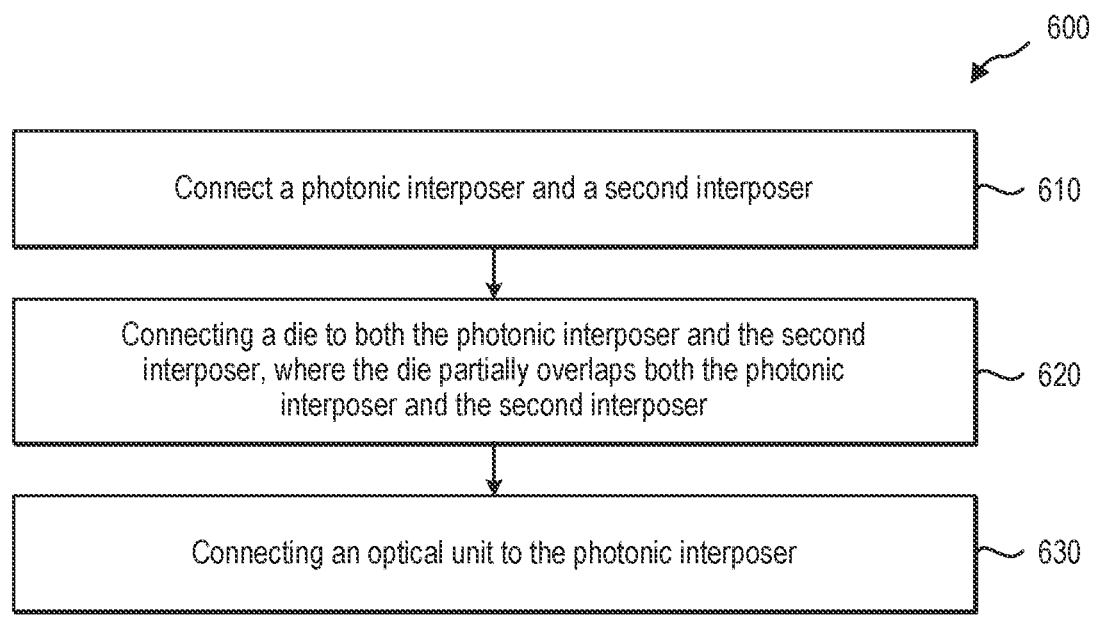
FIG. 7 is an embodiment of a method of manufacturing a circuit package, according to at least one embodiment of the present disclosure.

FIG. 7 is an embodiment of a method 600 of manufacturing a circuit package (e.g., circuit package 100, 200, 300, 400, 500). The method 600 includes connecting a photonic interposer (e.g., photonic interposer 110, 210, 310, 410, 510, 510-2, 510-3) and a second interposer (e.g., second interposer 120, 220, 320, 420, 520, third interposer 510-2) at act 610. The method 600 includes connecting a die (e.g., die 130, 230, 330, 330-2, 430, 430-2, 530, 530-2, 530-3, 530-4) to both the photonic interposer and the second interposer, where the die partially overlaps both the photonic interposer and the second interposer. The method 600 includes connecting an optical element (e.g., FAU 250, 350, 450) to the photonic interposer.

The method 600 optionally includes applying a mold (e.g., mold 240, 340, 440) to the photonic interposer and the second interposer to form a rigid unit. In some embodiments the mold is silicon or silicon alloy. In some embodiments, the mold includes a material that matches a thermal expansion of one or more of the photonic interposer and the second interposer.

The method 600 optionally includes forming the second interposer as a mold. The method 600 optionally includes providing one or more through substrate vias, through mold vias, bond via arrays, or combinations thereof through the mold.

The method 600 optionally includes attaching a second die to one or more of the photonic interposer and the second interposer. The method 600 optionally includes attaching a third die to one or more of the photonic interposer, the second interposer, or a third interposer.

Figure 8:
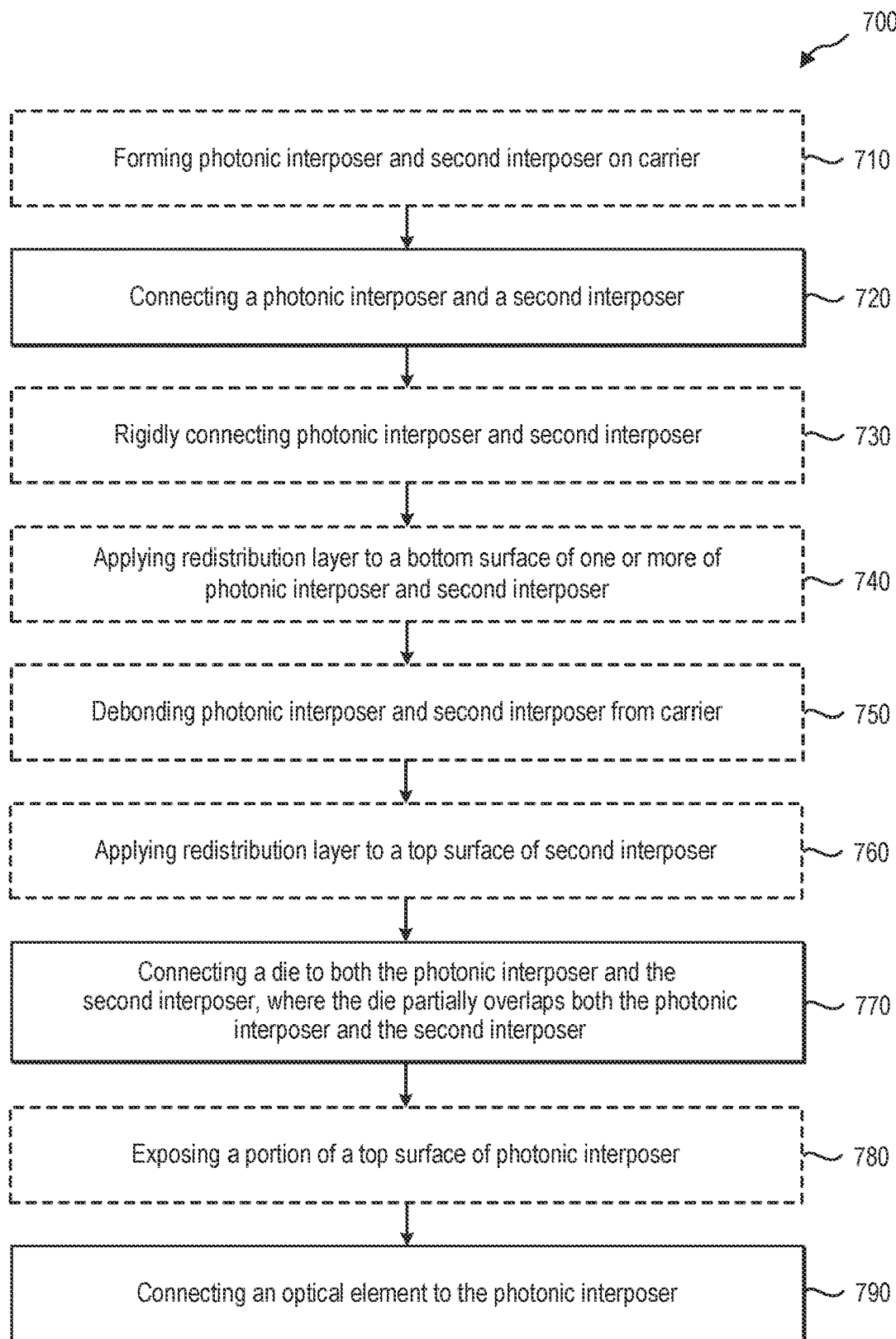
FIG. 8 is an embodiment of a method of manufacturing a circuit package, according to at least one embodiment of the present disclosure.

FIG. 8 is an embodiment of a method 700 of manufacturing a circuit package (e.g., circuit package 100, 200, 300, 400, 500). The method 700 optionally includes forming a photonic interposer (e.g., photonic interposer 110, 210, 310, 410, 510, 510-2, 510-3) and a second interposer (e.g., second interposer 120, 220, 320, 420, 520, third interposer 510-2) on a carrier at act 710.

The method 700 includes connecting a photonic interposer and a second interposer at act 720. The method 700 optionally includes rigidly connecting a photonic interposer and a second interposer at act 730.

The method 700 optionally includes applying redistribution layer to a bottom surface of one or more of photonic interposer and second interposer at act 740. The method 700 optionally includes debonding photonic interposer and second interposer from carrier at act 750. The method optionally includes applying redistribution layer to a top surface of second interposer at act 760.

The method 700 includes connecting a die (e.g., die 130, 230, 330, 330-2, 430, 430-2, 530, 530-2, 530-3, 530-4) to both the photonic interposer and the second interposer, where the die partially overlaps both the photonic interposer and the second interposer at act 770. The method 700 optionally includes exposing a portion of a top surface of photonic interposer at act 780. Exposing the portion of the top surface of the photonic interposer may include one or more of laser drilling, etching, or clearing. The method 700 includes connecting an optical element (e.g., FAU 250, 350, 450) to the photonic interposer at act 790 optionally at the exposed portion of act 780.

The method 700 optionally includes applying a mold (e.g., mold 240, 340, 440) to the photonic interposer and the second interposer to form a rigid unit. In some embodiments the mold is silicon or silicon alloy. In some embodiments, the mold includes a material that matches a thermal expansion of one or more of the photonic interposer and the second interposer.

The method 700 optionally includes forming the second interposer as a mold. The method 700 optionally includes providing one or more through substrate vias, through mold vias, bond via arrays, or combinations thereof through the mold.

The method 700 optionally includes attaching a second die to one or more of the photonic interposer and the second interposer. The method 700 optionally includes attaching a third die to one or more of the photonic interposer, the second interposer, or a third interposer.

Figure 9:
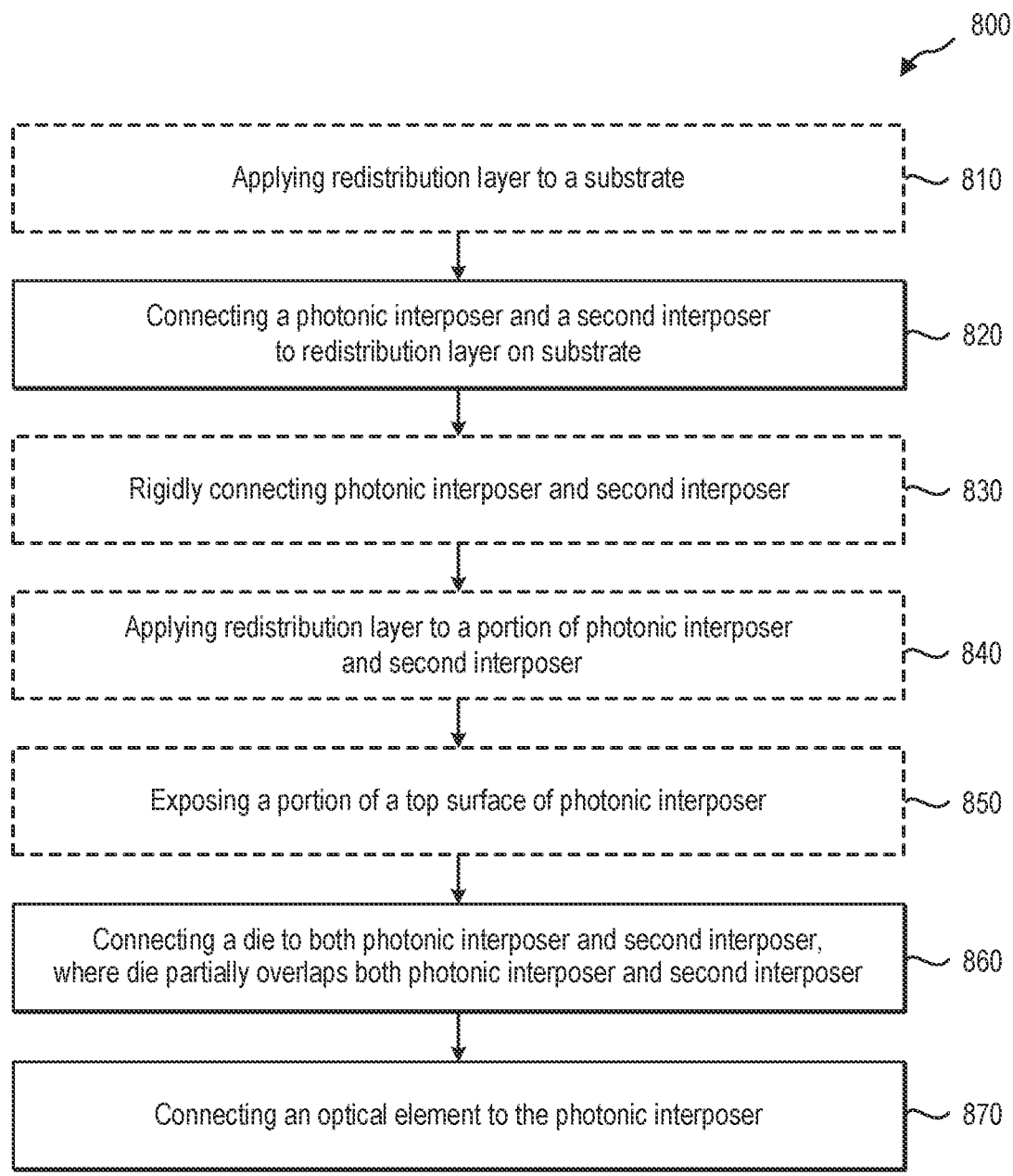
FIG. 9 is an embodiment of a method of manufacturing a circuit package, according to at least one embodiment of the present disclosure.

FIG. 9 is an embodiment of a method 800 of manufacturing a circuit package (e.g., circuit package 100, 200, 300, 400, 500). The method 800 optionally includes applying redistribution layer (e.g., RDL layer 460) to a substrate (e.g., substrate 201, 301, 401) at act 810. The method 800 includes connecting a photonic interposer (e.g., photonic interposer 110, 210, 310, 410, 510, 510-2, 510-3) and a second interposer (e.g., second interposer 120, 220, 320, 420, 520, third interposer 510-2) to the redistribution layer on the substrate at act 820.

The method 800 optionally includes rigidly connecting a photonic interposer and a second interposer at act 830. The method 800 optionally includes applying redistribution layer to a portion of photonic interposer and second interposer at act 840.

In some implementations, applying redistribution layer to a portion of photonic interposer and second interposer forms a plurality of high precision pads on two or more of the photonic interposer, the second interposer, a second photonic interposer, a third interposer, and a third photonic interposer. In some implementations, forming the plurality of high precision pads facilitate connecting the die to the two or more of the photonic interposer, the second interposer, a second photonic interposer, a third interposer, and a third photonic interposer. In some implementations, facilitating connecting the die to the two or more of the photonic interposer, the second interposer, a second photonic interposer, a third interposer, and a third photonic interposer includes forming a top surface on the high precision pads that is substantially the same vertical height. In some implementations, the high precision pads remove the tolerance issues between two or more of the photonic interposer, the second interposer, a second photonic interposer, a third interposer, and a third photonic interposer in one or more of the X-direction, the Y-direction, and the vertical direction.

The method 800 optionally includes exposing a portion of a top surface of the photonic interposer at act 850.

The method includes connecting a die (e.g., die 130, 230, 330, 330-2, 430, 430-2, 530, 530-2, 530-3, 530-4) to both the photonic interposer and the second interposer, where the die partially overlaps both the photonic interposer and the second interposer at act 860. The method 800 optionally includes connecting an optical element (e.g., FAU 250, 350, 450) to the photonic interposer at act 870.

The method 800 optionally includes applying a mold (e.g., mold 240, 340, 440) to the photonic interposer and the second interposer to form a rigid unit. In some embodiments the mold is silicon or silicon alloy. In some embodiments, the mold includes a material that matches a thermal expansion of one or more of the photonic interposer and the second interposer.

The method 800 optionally includes forming the second interposer as a mold. The method 800 optionally includes providing one or more through substrate vias, through mold vias, bond via arrays, or combinations thereof through the mold.

The method 800 optionally includes attaching a second die to one or more of the photonic interposer and the second interposer. The method 800 optionally includes attaching a third die to one or more of the photonic interposer, the second interposer, or a third interposer.

Figure 10:
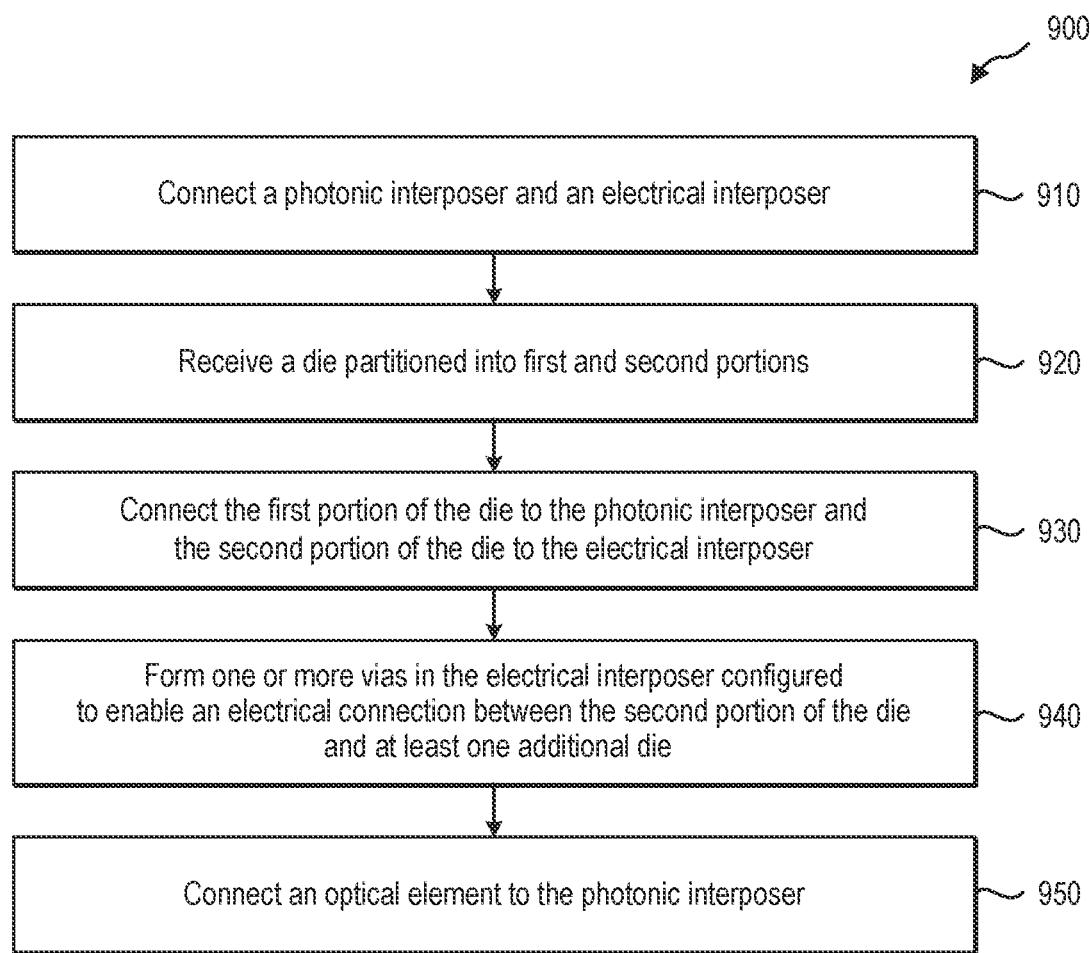
FIG. 10 is an embodiment of a method of manufacturing a circuit package, according to at least one embodiment of the present disclosure.

FIG. 10 is an embodiment of a method 900 of manufacturing a circuit package (e.g., circuit package 100, 200, 300, 400, 500). The method 900 includes connecting a photonic interposer (e.g., photonic interposers 110, 210, 310, 410, 510, 510-2, 510-3) and an electrical interposer (e.g., second interposers 120, 220, 320, 420, 520, and third interposer 520-2) at act 910. The method 900 includes receiving a die (e.g., die 130, 230, 330, 430, 530, 530-2, 530-3, 530-4, 530-5, 530-6) partitioned into first and second portions (e.g., analog-mixed signal portions 132-1, 232-1, 332-1, 432-1, 532-1, electronic portions 132-2, 232-2, 332-2, 432-2, 532-2, other portions) at act 920.

The method 900 includes connecting the first portion of the die to the photonic interposer and the second portion of the die to the electrical interposer at act 930. The method 900 includes forming one or more vias in the electrical interposer configured to enable an electrical connection between the second portion of the die and at least one additional die at act 940. The method 900 includes connecting an optical element (e.g., FAU 250, 350, 450) to the photonic interposer at act 950.

Figure 11:
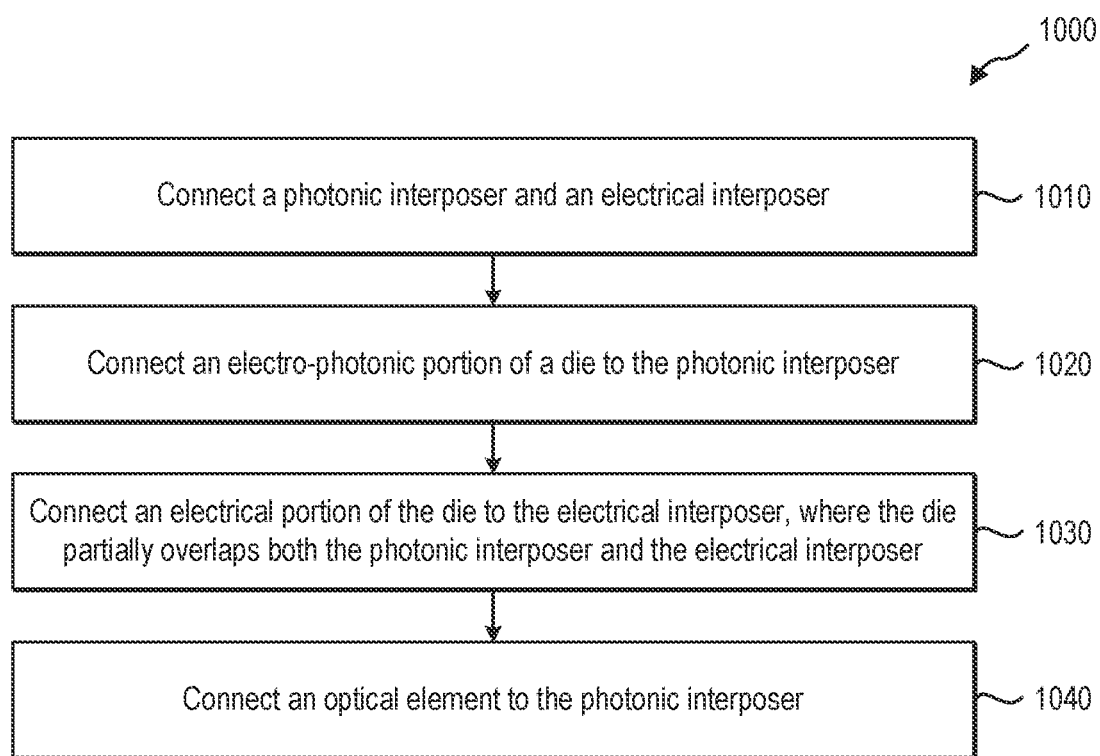
FIG. 11 is an embodiment of a method of manufacturing a circuit package, according to at least one embodiment of the present disclosure.

FIG. 11 is an embodiment of a method 1000 for manufacturing a circuit package (e.g., circuit package 100, 200, 300, 400, 500). The method 1000 includes connecting a photonic interposer (e.g., photonic interposers 110, 210, 310, 410, 510, 510-2, 510-3) and an electrical interposer (e.g., second interposers 120, 220, 320, 420, 520, and third interposer 520-2) at act 1010. The method 1000 includes connecting an analog-mixed signal portion (e.g., analog-mixed signal portions 132-1, 232-1, 332-1, 432-1, 532-1) of a die (e.g., die 130, 230, 330, 430, 530, 530-2, 530-3, 530-4, 530-5, 530-6) to the photonic interposer at act 1020.

The method 1000 further includes connecting an electronic portion (e.g., electronic portions 132-2, 232-2, 332-2, 432-2, 532-2) of the die to the electrical interposer at act 1030. The die partially overlaps both the photonic interposer and the electrical interposer. The method 1000 includes connecting an optical element (e.g., FAU 250, 350, 450) to the photonic interposer at act 1040.

In some embodiments, the method 1000 includes connecting a driver of the analog-mixed signal portion of the die to a modulator of the photonic interposer. The modulator may be any type of modulator, including a thermally stable modulator and/or an electro-absorption modulator. In some embodiments, the method 1000 includes connecting a TIA of the analog-mixed signal portion of the die to a photodetector of the photonic interposer.

In some embodiments, the method 1000 includes rigidly connecting the photonic interposer and the electrical interposer. The method 1000 may include applying a mold to the photonic interposer and the electrical interposer to form a rigid unit. The mold may be formed from silicon and/or a silicon alloy. In some embodiments, the mold includes a material that matches a thermal expansion of one or more of the photonic interposer and the electrical interposer. In some embodiments, the electrical interposer is formed as a mold. In some embodiments, the electrical interposer includes a through mold via.

In some embodiments, the electrical interposer includes a bond via array. In some embodiments, the method 1000 includes forming the photonic interposer and the electrical interposer on a carrier. In some embodiments, the method 1000 includes applying redistribution layer to a bottom surface of one or more of the photonic interposer and the electrical interposer. In some embodiments, the photonic interposer and the electrical interposer are debonded from the carrier.

In some embodiments, the method 1000 includes applying a redistribution layer to the electrical interposer. In some embodiments, the redistribution layer is applied to a top surface of the electrical interposer. In some embodiments, the method 1000 includes attaching the die to the redistribution layer on the top surface of the electrical interposer.

In some embodiments, a second die is attached to one or more of the photonic interposer and the electrical interposer. In some embodiments, a third die is attached to one or more of the photonic interposer, the electrical interposer, or a third interposer. The third interposer may be a second photonic interposer. In some embodiments, the third interposer is a non-photonic interposer.

In some embodiments, one or more of the photonic interposer and the third interposer are photonic integrated circuits. In some embodiments, the electrical interposer is an SI interposer. In some embodiments, the electrical interposer is an SI bridge.

In some embodiments, the method 1000 includes attaching a third die to one or more of the photonic interposer, the electrical interposer, and the third interposer. In some embodiments, the method 1000 includes exposing a portion of a top surface of one or more of the photonic interposer, the electrical interposer, and the third interposer. In some embodiments, exposing the portion of the top surface of one or more of the photonic interposer, the electrical interposer, and the third interposer includes one or more of laser drilling, etching, or clearing.

In some embodiments, the method 1000 includes applying one or more optical elements to a portion of a top surface of one or more of the photonic interposer, the electrical interposer, and the third interposer. In some embodiments, applying the one or more optical elements to a portion of a top surface of one or more of the photonic interposer, the electrical interposer, and the third interposer includes directly applying the one or more optical elements to a portion of a top surface of one or more of the photonic interposer, the electrical interposer, and the third interposer. In some embodiments, directly applying the one or more optical elements to a portion of a top surface of one or more of the photonic interposer, the electrical interposer, and the third interposer includes directly applying the one or more optical elements to the exposed portion of the one or more of the photonic interposer, the electrical interposer, and the third interposer.

In some embodiments, the method includes applying a redistribution layer to a substrate. In some embodiments, the method 1000 includes attaching two or more of photonic interposers, the electrical interposer, and the third interposer to the redistribution layer on the substrate. In some embodiments, the method 1000 includes applying the redistribution layer to a portion of two or more of the photonic interposers, the electrical interposer, and the third interposer. In some embodiments, applying the redistribution layer to the portion of the two or more of the photonic interposer, the electrical interposer, and the third interposer forms a plurality of high precision pads on the two or more of the photonic interposer, the electrical interposer, and the third interposer. In some embodiments, forming the plurality of high precision pads on the two or more of the photonic interposer, the electrical interposer, and the third interposer facilitate connecting the die to the two or more of the photonic interposer, the electrical interposer, and the third interposer. In some embodiments, facilitating connecting the die to the two or more of the photonic interposer, the electrical interposer, and the third interposer includes forming a top surface on the high precision pads that is substantially the same vertical height. In some embodiments, the high precision pads remove the tolerance issues between the two or more of the photonic interposer, the electrical interposer, and the third interposer in one or more of the X-direction, the Y-direction, and the vertical direction.

One or more specific embodiments of the present disclosure are described herein. These described embodiments are examples of the presently disclosed techniques. Additionally, in an effort to provide a concise description of these embodiments, not all features of an actual embodiment may be described in the specification. It should be appreciated that in the development of any such actual implementation, as in any engineering or design project, numerous embodiment-specific decisions will be made to achieve the developers' specific goals, such as compliance with system-related and business-related constraints, which may vary from one embodiment to another. Moreover, it should be appreciated that such a development effort might be complex and time consuming, but would nevertheless be a routine undertaking of design, fabrication, and manufacture for those of ordinary skill having the benefit of this disclosure.

The articles "a," "an," and "the" are intended to mean that there are one or more of the elements in the preceding descriptions. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. For example, any element described in relation to an embodiment herein may be combinable with any element of any other embodiment described herein. Numbers, percentages, ratios, or other values stated herein are intended to include that value, and also other values that are "about" or "approximately" the stated value, as would be appreciated by one of ordinary skill in the art encompassed by embodiments of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

A person having ordinary skill in the art should realize in view of the present disclosure that equivalent constructions do not depart from the spirit and scope of the present disclosure, and that various changes, substitutions, and alterations may be made to embodiments disclosed herein without departing from the spirit and scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the embodiments that falls within the meaning and scope of the claims is to be embraced by the claims.

The terms "approximately," "about," and "substantially" as used herein represent an amount close to the stated amount that still performs a desired function or achieves a desired result. For example, the terms "approximately," "about," and "substantially" may refer to an amount that is within less than 5% of, within less than 1% of, within less than 0.1% of, and within less than 0.01% of a stated amount. Further, it should be understood that any directions or reference frames in the preceding description are merely relative directions or movements. For example, any references to "up" and "down" or "above" or "below" are merely descriptive of the relative position or movement of the related elements.

The present disclosure may be embodied in other specific forms without departing from its spirit or characteristics. The described embodiments are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. A circuit package, comprising:
a photonic interposer;
an electrical interposer;
a die including an analog-mixed signal portion and an electronic portion, the die partially overlapping both the photonic interposer and the electrical interposer, the analog-mixed signal portion connected to the photonic interposer, the electronic portion connected to the electrical interposer, wherein the photonic interposer includes a modulator; and
a plurality of electrical interconnects between the photonic interposer and the die.

2. The circuit package of claim 1, wherein the modulator is a thermally stable modulator.

3. The circuit package of claim 2, wherein the thermally stable modulator is an electro-absorption modulator (EAM).

4. The circuit package of claim 1, wherein the photonic interposer includes a photodetector.

5. The circuit package of claim 4, wherein the photodetector includes a photodiode.

6. The circuit package of claim 1, wherein one or more of the plurality of electrical interconnects are less than 100 microns in length.

7. The circuit package of claim 1, wherein one or more of the plurality of electrical interconnects is one or more of one or more of soldering bumps, wires, copper pillars, wirebonds, through-substrate vias (TSVs), through-dielectric via (TDVs), re-distribution layers (RDLs), or landing pads.

8. The circuit package of claim 1, wherein the photonic interposer includes a photonic integrated circuit.

9. A circuit package, comprising:
a photonic interposer;
an electrical interposer;
a die including an analog-mixed signal portion and an electronic portion, the die partially overlapping both the photonic interposer and the electrical interposer, the analog-mixed signal portion connected to the photonic interposer, the electronic portion connected to the electrical interposer, wherein the analog-mixed signal portion includes a driver; and
a plurality of electrical interconnects between the photonic interposer and the die.

10. The circuit package of claim 9, wherein the plurality of electrical interconnects includes a first electrical interconnect connecting the photonic interposer to the analog-mixed signal portion, and wherein the driver is connected to a first end of the first electrical interconnect.

11. The circuit package of claim 10, wherein the photonic interposer includes a modulator, wherein the modulator is connected to a second end of the first electrical interconnect.

12. A circuit package, comprising:
a photonic interposer;
an electrical interposer;
a die including an analog-mixed signal portion and an electronic portion, the die partially overlapping both the photonic interposer and the electrical interposer, the analog-mixed signal portion connected to the photonic interposer, the electronic portion connected to the electrical interposer, wherein the analog-mixed signal portion includes a transimpedance amplifier (TIA); and
a plurality of electrical interconnects between the photonic interposer and the die.

13. The circuit package of claim 12, wherein the plurality of electrical interconnects includes a second electrical interconnect connecting the photonic interposer and the analog-mixed signal portion, and wherein the TIA is connected to a first end of the second electrical interconnect.

14. The circuit package of claim 13, wherein the photonic interposer includes a photodetector, and wherein the photodetector is connected to a second end of the second electrical interconnect of the plurality of electrical interconnects.

15. A circuit package, comprising:
a photonic interposer;
an electrical interposer;
a die including an analog-mixed signal portion and an electronic portion, the die partially overlapping both the photonic interposer and the electrical interposer, the analog-mixed signal portion connected to the photonic interposer, the electronic portion connected to the electrical interposer;
a plurality of electrical interconnects between the photonic interposer and the die; and
a second die including a processing element, the processing element electrically connected to the electrical interposer.

16. The circuit package of claim 15, wherein the second die is electrically connected to the electronic portion through the electrical interposer.

17. The circuit package of claim 16, wherein the second die is electrically connected to the analog-mixed signal portion through the electronic portion and the electrical interposer.

18. The circuit package of claim 17, wherein the second die is electrically connected to the photonic interposer through the analog-mixed signal portion, the electronic portion, and the electrical interposer.

19. The circuit package of claim 18, wherein the second die is electrically connected to the photonic interposer through a driver in the analog-mixed signal portion.

20. The circuit package of claim 19, wherein the second die is electrically connected to the photonic interposer through a modulator in the photonic interposer.

21. The circuit package of claim 18, wherein the second die is electrically connected to the photonic interposer through the analog-mixed signal portion, the electronic portion, and the electrical interposer and optically connected to a fiber array unit through the photonic interposer.

22. A circuit package, comprising:
a photonic interposer;
an electrical interposer;
a die including an analog-mixed signal portion and an electronic portion, the die partially overlapping both the photonic interposer and the electrical interposer, the analog-mixed signal portion connected to the photonic interposer, the electronic portion connected to the electrical interposer;
a plurality of electrical interconnects between the photonic interposer and the die; and
a fiber array unit (FAU) between the photonic interposer and the die.

23. The circuit package of claim 22, wherein one or more of a modulator or a photodetector are connected to the FAU with an FAU connection.

24. The circuit package of claim 23, wherein the FAU connection is a bidirectional channel.

25. The circuit package of claim 24, wherein the bidirectional channel includes one or more waveguides.

* * * * *